(12) United States Patent
Khwa et al.

(10) Patent No.: US 12,205,017 B2
(45) Date of Patent: *Jan. 21, 2025

(54) METHOD AND APPARATUS FOR DEFECT-TOLERANT MEMORY-BASED ARTIFICIAL NEURAL NETWORK

(71) Applicant: Taiwan Semiconductor Manufacturing Co., Ltd., Hsin-Chu (TW)

(72) Inventors: Win-San Khwa, Hsin-Chu (TW); Yu-Der Chih, Hsin-Chu (TW); Yi-Chun Shih, Taipei (TW); Chien-Yin Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,769

(22) Filed: Aug. 8, 2023

(65) Prior Publication Data

US 2023/0385623 A1    Nov. 30, 2023

Related U.S. Application Data

(63) Continuation of application No. 17/883,594, filed on Aug. 8, 2022, now Pat. No. 11,797,831, which is a continuation of application No. 16/542,049, filed on Aug. 15, 2019, now Pat. No. 11,461,623.

(60) Provisional application No. 62/747,277, filed on Oct. 18, 2018.

(51) Int. Cl.
*G11C 11/54*     (2006.01)
*G06N 3/063*     (2023.01)
*G06N 3/08*      (2023.01)
*G11C 29/04*     (2006.01)
*G11C 7/10*      (2006.01)

(52) U.S. Cl.
CPC .............. *G06N 3/063* (2013.01); *G06N 3/08* (2013.01); *G11C 11/54* (2013.01); *G11C 29/04* (2013.01); *G11C 7/1006* (2013.01)

(58) Field of Classification Search
CPC .......... G06N 3/063; G06N 3/08; G11C 11/54; G11C 29/04; G11C 7/1006
USPC ....................................................... 706/41
See application file for complete search history.

(56) References Cited

U.S. PATENT DOCUMENTS

| | | | |
|---|---|---|---|
| 11,436,143 B2 * | 9/2022 | Han | G06F 12/0842 |
| 11,461,623 B2 | 10/2022 | Khwa et al. | |
| 2015/0287476 A1 | 10/2015 | Park et al. | |

(Continued)

*Primary Examiner* — Ly D Pham
(74) *Attorney, Agent, or Firm* — Duane Morris LLP

(57) ABSTRACT

Disclosed is a methods and apparatus which can improve defect tolerability of a hardware-based neural network. In one embodiment, a method for performing a calculation of values on first neurons of a first layer in a neural network, includes: receiving a first pattern of a memory cell array; determining a second pattern of the memory cell array according to a third pattern; determining at least one pair of columns of the memory cell array according to the first pattern and the second pattern; switching input data of two columns of each of the at least one pair of columns of the memory cell array; and switching output data of the two columns in each of the at least one pair of columns of the memory cell array so as to determine the values on the first neurons of the first layer.

20 Claims, 16 Drawing Sheets

(56) References Cited

U.S. PATENT DOCUMENTS

| | | |
|---|---|---|
| 2017/0098478 A1 | 4/2017 | Lee et al. |
| 2017/0193361 A1 | 7/2017 | Chilimbi et al. |
| 2017/0255502 A1 | 9/2017 | Fujinami et al. |
| 2017/0372798 A1 | 12/2017 | Hoya |
| 2018/0061344 A1* | 3/2018 | Kurokawa ........... G09G 3/3233 |
| 2018/0075350 A1 | 3/2018 | Gokmen |
| 2018/0374558 A1 | 12/2018 | Chou et al. |
| 2019/0074068 A1 | 3/2019 | Eldredge et al. |
| 2019/0238136 A1 | 8/2019 | Asnaashari |
| 2019/0279734 A1 | 9/2019 | Kang |
| 2022/0036957 A1 | 2/2022 | Sheperek et al. |

* cited by examiner $$[W]_{N \times M} = \begin{bmatrix} W_{1,1}, & W_{1,2}, & W_{1,3}, & \cdots\cdots, & W_{1,M} \\ W_{2,1}, & W_{2,2}, & W_{2,3}, & \cdots\cdots, & W_{2,M} \\ W_{3,1}, & W_{3,2}, & W_{3,3}, & \cdots\cdots, & W_{3,M} \\ \vdots & \vdots & \vdots & \ddots & \vdots \\ W_{N,1}, & W_{N,2}, & W_{N,3}, & \cdots\cdots, & W_{N,M} \end{bmatrix}$$

$$WPS = [\; S_1\;,\; S_2\;,\; S_3\;,\cdots\cdots,\; S_M\;]$$

FIG. 2

$$[D]_{N \times M} = \begin{bmatrix} D_{1,1}, & D_{1,2}, & D_{1,3}, & \cdots\cdots, & D_{1,M} \\ D_{2,1}, & D_{2,2}, & D_{2,3}, & \cdots\cdots, & D_{2,M} \\ D_{3,1}, & D_{3,2}, & D_{3,3}, & \cdots\cdots, & D_{3,M} \\ \vdots & \vdots & \vdots & \ddots & \vdots \\ D_{N,1}, & D_{N,2}, & D_{N,3}, & \cdots\cdots, & D_{N,M} \end{bmatrix}$$

$$DPI = [\ d_1\ ,\ d_2\ ,\ d_3\ , \cdots\cdots,\ d_M\ ]$$

206
WPS =

| 1 | 2 | 3 | • | • | • | • | • | • | M |
|---|---|---|---|---|---|---|---|---|---|
| 1 | 2 | 1 | • | • | • | 0 | | 3 | 0 |

300
$[D]_{N \times M}=$

| 1 | 1 | 0 | 1 | 0 | 1 |
|---|---|---|---|---|---|
| 1 | 0 | 1 | 1 | 0 | 0 |
| • | • | • | • | • | • |
| • | • | • | • | • | • |
| • | • | • | • | • | • |
| 1 | 1 | 1 | 1 | 1 | 1 |

512
FBC =

| 0 | 2 | 1 | • • • | 0 | 2 | 1 |
|---|---|---|---|---|---|---|

514
Statistic Severity (SS) =

| 1 | 2 | 3 | • • • | M−2 | M−1 | M |
|---|---|---|---|---|---|---|
| 0 | 4 | 1 | • • • | 0 | 6 | 1 |

FIG. 5B

740 swap

| Input I/O's | 0 | 1 | 0 | 1 | 1 | 0 | 1 | 0 |
|---|---|---|---|---|---|---|---|---|
| temp 1 | | | | | | 0 | 1 | 1 |
| temp 2 | | | | | | 1 | 0 | 1 |
| or_mask | 0 | 0 | 1 | 0 | 0 | 0 | 0 | 0 |
| and_mask | 1 | 1 | 1 | 1 | 0 | 1 | 1 | 1 |
| Output I/O's | 0 | 1 | 1 | 1 | 0 | 0 | 1 | 0 |

FIG. 7C

METHOD AND APPARATUS FOR DEFECT-TOLERANT MEMORY-BASED ARTIFICIAL NEURAL NETWORK

This application is a continuation of U.S. patent application Ser. No. 17/883,594, filed Aug. 8, 2022, which is a continuation of U.S. patent application Ser. No. 16/542,049, filed Aug. 15, 2019, which claims the benefit and priority of U.S. Provisional Application No. 62/747,277, filed Oct. 18, 2018, the contents of each are hereby incorporated by reference in their entireties.

BACKGROUND

Artificial neural networks (ANN) are one of the main tools used in machine learning, inspired by animal brains. A neural network consists of input and output layers. In common ANN implementations, the signal at a connection between artificial neurons is a real number, and the output of each artificial neuron is computed by some non-linear function of the sum of its inputs. The connections between artificial neurons are called "edges". Artificial neurons and edges typically have a weight that adjusts as learning proceeds. The weight increases or decreases indicating an increase or decrease of the strength of the signal at a connection between two neurons. Artificial neurons may have a threshold such that the signal is only sent if the aggregate signal crosses that threshold. Typically, artificial neurons are aggregated into layers. Different layers may perform different kinds of transformations on their inputs. Signals travel from the first layer (the input layer) to the last layer (the output layer), possibly after traversing the layers multiple times.

The networks of neurons are thus connected through edges with different transmission efficiencies. Information flowing through the edges is multiplied by a constant which reflects their efficiency and accuracy. In a hardware-based ANN, the weight of a neuron can be programed on a cell of a memory cell array. Defective cells in the memory cell array affect the accuracy of the signals traveling between neurons in respective layers. Therefore, there exists a need to develop a method to improve tolerance of artificial neural network to defective cells in memory cell arrays.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

FIG. 2 illustrates an exemplary weight pattern between an input layer and a hidden layer in a network, in accordance with some embodiments of the present disclosure.

FIG. 3A illustrates an exemplary defect pattern $[D]_{N \times M}$ of a memory cell array, in accordance with some embodiments of the present disclosure.

FIG. 5B illustrates a schematic for rearranging a weight pattern and input data on a memory cell array, in accordance with some embodiment of the present disclosure.

FIG. 7C illustrates a table with exemplary data in a swapping process presented in FIG. 7B, in accordance with some embodiments of the present disclosure.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

There are two fundamentally different alternatives for the implementation of neural networks: a software simulation in conventional computers or a special hardware solution capable of dramatically decreasing execution time. A software simulation can be useful to develop and debug new algorithms, as well as to benchmark them using small networks. However, if large networks are to be used, a software simulation is not enough. The problem is the time required for the learning process, which can increase exponentially with the size of the network. Neural networks without learning, however, are rather uninteresting. But the main objective of building special hardware is to provide a platform for efficient adaptive systems, capable of updating their parameters in the course of time. New hardware solutions are therefore necessary. Hardware-based solutions using memory cell arrays can provide improved power efficiency. Intrinsic differences (e.g., type and address of defective memory cells in a memory cell array) between memory cells in a memory cell array are typically caused by fabrication processes, which leads to intrinsic differences between different memory cell arrays. Individual training processes for different memory cell arrays can significantly increase the cost overhead. This disclosure presents various embodiments of methods and apparatus which can improve defect tolerability of a hardware-based neural network.

Figure 1:
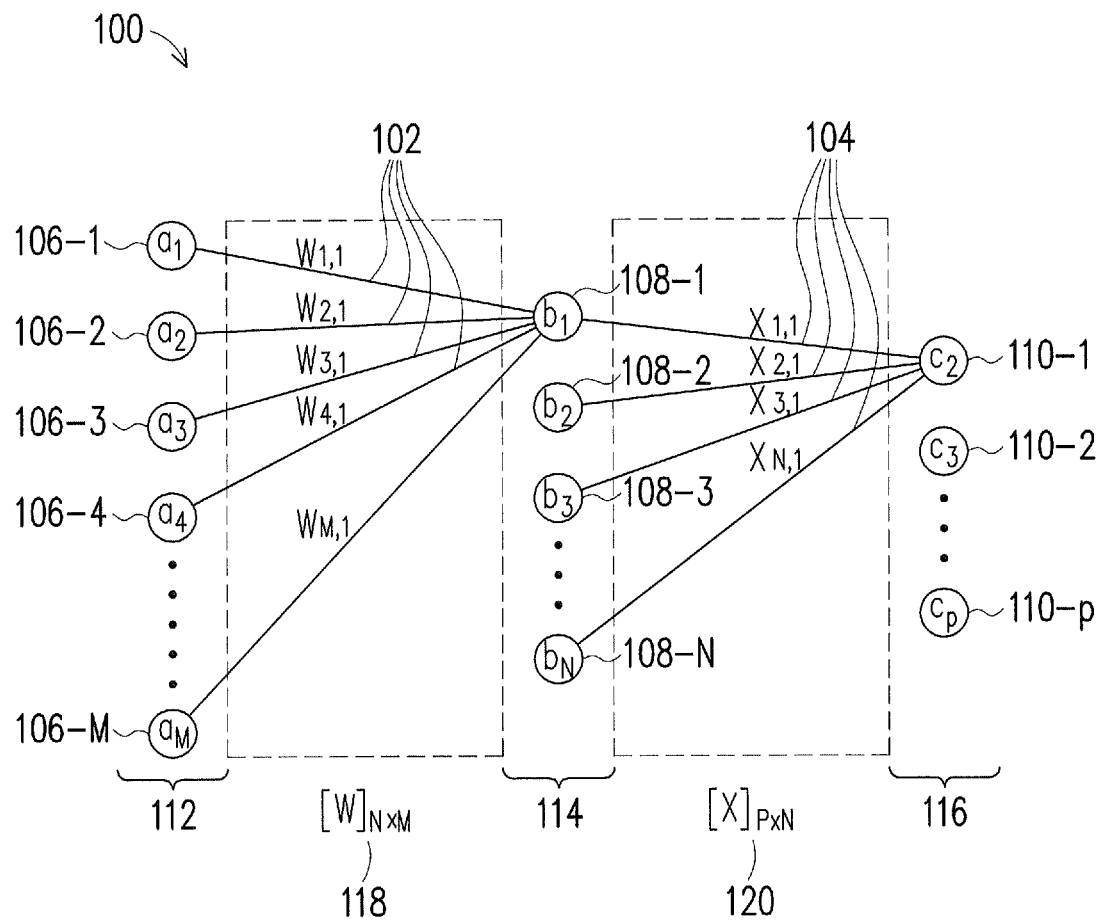
FIG. 1 illustrates an exemplary diagram of a fully connected network of an artificial neural network (ANN), in accordance with some embodiments of present disclosure.

FIG. 1 illustrates an exemplary diagram of a fully connected network 100 of an artificial neural network (ANN), in accordance with some embodiments of present disclosure. The network 100 comprises an input layer 112, a hidden layer 114, and an output layer 116. It is noted that the network 100 is merely an example, and is not intended to limit the present disclosure. Accordingly, it is understood that additional hidden layers 114 may be provided in between the input layer 112 and the output layer 116 in FIG. 1, and each layers (i.e., 112, 114, and 116) may comprise different numbers of neurons, which are within the scope of this invention. It should be also noted that values on the neurons can be determined using different algorithms, which are also within the scope of this invention.

In the illustrated embodiments, the input layer 112 comprises a plurality of neurons 106. Each of the plurality of neurons 106 comprises a respective value, i.e., $a_1$ on neuron 106-1, $a_2$ on neuron 106-2, $a_3$ on neuron 106-3, . . . and $a_M$ on neuron 106-M, wherein M is a positive integer. In some embodiments, the values on neurons 106 on the input layer 112 is $[A]_{M \times 1} = [a_1; a_2; a_3; \ldots ; a_M]$. Further, the hidden layer 114 comprises a plurality of neurons 108. Each of the plurality of neurons 108 comprises a respective value, i.e., $b_1$ on neuron 108-1, $b_2$ on neuron 108-2, $b_3$ on neuron 108-3, . . . , and $b_N$ on neuron 108-N, wherein N is a positive integer. In some embodiments, the values on neurons 108 on the hidden layer 114 is $[B]_{N \times 1} = [b_1; b_2; b_3; \ldots ; b_M]$. Similarly, the output layer 116 comprises a plurality of neurons 110, according to some embodiments. Each of the plurality of neurons 110 comprises a respective value, i.e., $c_1, c_2, c_3, \ldots$, and $c_P$, wherein P is a positive integer. In some embodiments, the values on neurons 110 on the output layer 116 is $[C]_{P \times 1} = [c_1; c_2; c_3; \ldots ; c_P]$.

In some embodiments, each of the plurality of neurons 106 in the input layer 112 is coupled to each of the plurality of neurons 108 in the hidden layer 114 through a plurality of corresponding weights 102. For example, weights $w_{1,1}$, $w_{2,1}, \ldots$, and $w_{M,1}$, are used to couple neurons 106-1, 106-2, 106-3, . . . 106-M of the input layer 112 and neuron 108-1 of the hidden layer 114. In some embodiments, each of the corresponding weights 102 between the neurons 106 of the input layer 112 and the neurons 108 of the hidden layer 114 has a value of either "0" or "1". In some embodiments, the value of each of the corresponding weights ($w_{i,j}$) 102 represents a contribution level of the values ($a_i$) of corresponding neurons 106 to the value (i.e., $b_j$) of the corresponding neurons 108, wherein i≤M, j≤N, i and j are positive integers.

Similarly, each of the plurality of neurons 108 in the hidden layer 114 is coupled to each of the plurality of neurons 110 in the output layer 116 through a plurality of corresponding weights 104. For example, weights, $x_{1,1}, x_{2,1}$, . . . , and $x_{P,1}$ are used to couple between neurons 108-1, 108-2, 108-3, . . . , and 108-N of the hidden layer 114 and neuron 110-1 of the output layer 116. In some embodiments, each of the corresponding weights 104 between the neurons 108 of the hidden layer 114 and the neurons 110 of the output layer 116 has a value of either "0" or "1". In some embodiments, the value of each of the corresponding weights ($x_{j,k}$) 104 also represents a contribution level of the values ($b_j$) of the corresponding neurons 108 to the values ($c_k$) of the corresponding neurons 110, wherein j≤N, k≤P, j and k are positive integers.

In some embodiments, the weights 102 and 104 are trained weights obtained through a training process according to predefined algorithms and methods. In some embodiments, a training algorithm is a back-propagation algorithm, in which the weights of the network is repeatedly adjusted so as to minimize a difference between the actual output vector and the descried output vector. In some embodiments, the weight training can be performed on-chip using a hardware memory cell array or off-chip using a software. In some embodiments, the weights of the network are determined assuming defect-free memory cell arrays.

In some embodiments, all the values of weights 102 between the input layer 112 and the hidden layer 114 are grouped together to form a first weight pattern 118 $[W]_{N \times M}$, which has N rows and M columns. In some embodiments, all the weights 104 between the hidden layer 108 and the output layer 110 are grouped together to form a second weight pattern 120 $[X]_{P \times N}$, which has P rows and N columns. In some embodiments, during implementation, the first weight pattern 118 $[W]_{N \times M}$ can be achieved by a first memory cell array and the second weight pattern 120 $[X]_{P \times N}$ is achieved by a second memory cell array. In some embodiments, the first memory cell array comprises an array of memory cells with a size of N×M and the second memory cell array comprises an array of memory cells with a size of P×N.

FIG. 2 illustrates an exemplary weight pattern 200 between an input layer 112 and a hidden layer 114 in a network 100, in accordance with some embodiments of the present disclosure. In the illustrated embodiments, a weight pattern sensitivity (WPS) 206 can be obtained according to the corresponding weight pattern 200, e.g., the first weight pattern 118 $[W]_{N \times M}$. In the illustrated embodiments, the WPS 200 comprises 1 row and M columns. In some embodiments, the first weight pattern 118 $[W]_{N \times M}$ comprises N rows, i.e., 204-1, 204-2, . . . , and 204-N, and M columns, i.e., 202-1, 202-2, and 202-M. In some embodiments, the first WPS 200 of the corresponding first weight pattern 118 $[W]_{N \times M}$ can be determined according to a number of "0" or "1" in a column 202. For example, when a number of "1"s in a column 202-j of the first weight pattern 118 $[W]_{N \times M}$ is equal to or greater than a predefined threshold value, the $S_j$ in the WPS 206 is determined as 1, wherein j≤M and is a positive integer. Similarly, when a number of "1"s in a column 202-j of the first weight pattern 118 $[W]_{N \times M}$ is less than the predefined threshold value, the value of the $S_j$ in the WPS 206 is determined as "0". In some embodiments, there is one WPS 200 for a corresponding weight pattern 118 $[W]_{N \times M}$.

In some embodiments, values in the WPS 206 is determined by comparing the number of "1"s in a column of a weight pattern against multi-levels of thresholds. For example, when the number of "1"s in a column of a weight pattern is equal to or greater than 0 and smaller than 5 and the WPS value for the column is 0; when the number of "1"s in a column of a weight pattern is equal to or greater than 5 and smaller than 10, the WPS value of the column is 1; when the number of "1"s in a column of a weight pattern is equal to or greater than 10 and smaller than 15, the WPS value of the column is 2; and when the number of "1"s in a column of a weight pattern is equal to or greater than 15 and smaller than the size of a column (e.g., N), the WPS value of the column is 3.

FIG. 3A illustrates an exemplary defect pattern $[D]_{N \times M}$ 300 of a memory cell array, in accordance with some embodiments of the present disclosure. In the illustrated embodiments, the defect pattern $[D]_{N \times M}$ 300 is obtained from measuring the memory cell array with a size of N×M for storing the first weight pattern 118 $[W]_{N \times M}$ and for determining the value on each of the neurons 108 of the hidden layer 114. In some embodiments, the memory cell array may comprises one of the following: a plurality of registers, a plurality of e-fuses, a static random access memory (SRAM) and a portion of a memory cell array.

In some embodiments, the defect pattern $[D]_{N \times M}$ 300 is obtained by writing "0" or "1" in each of the memory cells in the array followed by measuring the logical states saved on each of the memory cells in the array. When a memory cell which is written with "1" is measured "0", then the memory cell is determined to be defective and more specifically "set-to-reset" defective; and when a memory cell which is written with "0" is measured "1", then the memory cell is determined to be also defective and more specifically "reset-to-set" defective. In some other embodiments, when a memory cell which is written with "1" or "0" is also measured as "1" or "0", the memory cell is determined to be stable and thus non-defective. In some embodiments, when a memory cell is stable, $D_{ij}=1$; and when a memory cell is defective, $D_{ij}=0$, wherein i and j are positive integers, i≤M and j≤N.

In some embodiments, a defect pattern indicator (DPI) 306 can be obtained according to a number of defective memory cells in each of M columns 302 of the corresponding defect pattern $[D]_{N \times M}$ 300. In some embodiments, a DPI 306 comprises 1 row and M columns with respect to the corresponding defect pattern $[D]_{N \times M}$ 300, which comprises N rows 304 and M columns 302. In some embodiments, when the number of defective memory cells in a column 302-j of the defect pattern $[D]_{N \times M}$ 300 is equal to or greater than a predefined threshold value, the corresponding $d_j$ in the DPI 306 is determined as "0"; and when the number of defective memory cells in a column 302-j of the defect pattern $[D]_{N \times M}$ 300 is less than the predetermined threshold value, the corresponding di in the DPI 306 is determined as "1".

Figure 3B:
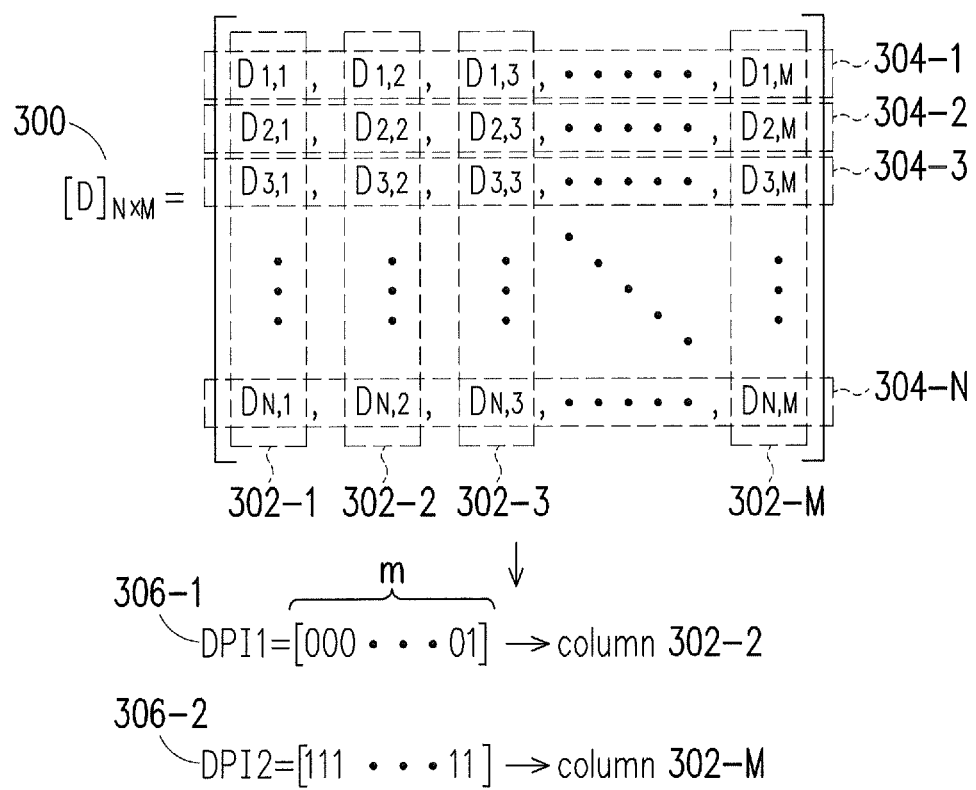
FIG. 3B illustrates an exemplary defect pattern $[D]_{N \times M}$ of a memory cell array, in accordance with some embodiments of the present disclosure.

FIG. 3B illustrates an exemplary defect pattern $[D]_{N \times M}$ 300 of a memory cell array, in accordance with some embodiments of the present disclosure. In the illustrated embodiments, the defect pattern $[D]_{N \times M}$ 300 is obtained from measuring a memory cell array with a size of N×M for storing the first weight pattern 118 $[W]_{N \times M}$ and for determining the value on each of the neurons 108 of the hidden layer 114. In some embodiments, the memory cell array may comprises one of the following: a plurality of registers, a plurality of e-fuses, a static random access memory (SRAM) and a portion of a memory cell array.

In some embodiments, the defect pattern $[D]_{N \times M}$ 300 is obtained by writing "0" or "1" in each of the memory cells in the array followed by measuring the logical states saved on each of the memory cells in the array. When a memory cell which is written with "1" is measured "0", then the memory cell is determined to be defective and more specifically "set-to-reset" defective; and when a memory cell which is written with "0" is measured "1", then the memory cell is determined to be also defective and more specifically "reset-to-set" defective. In some other embodiments, when a memory cell which is written with "1" or "0" is also measured as "1" or "0", the memory cell is determined to be stable and thus non-defective.

In some embodiments, a defect pattern indicator (DPI) 306 can be obtained according to a number of defective memory cells in a column 302. In some embodiments, a DPI 306 comprises 1 row and m columns, wherein m=$\log_2$ M, M is the number of columns in the corresponding defect pattern $[D]_{N \times M}$ 300. In some embodiments, when the number of defective memory cells in a column 302-j of the defect pattern $[D]_{N \times M}$ 300 is equal to or greater than a predefined threshold value, the DPI 306 is determined as the address of the column 302-j. For example, when the second column 302-2 and the last column 302-M are determined as columns that comprises defective memory cells that are greater than the predefined threshold value, the DPI-1 306-1 is [00 . . . 1] for the column 302-2 and DPI-2 306-2 is [11 . . . 1] for the column 302-M.

Figure 4A:
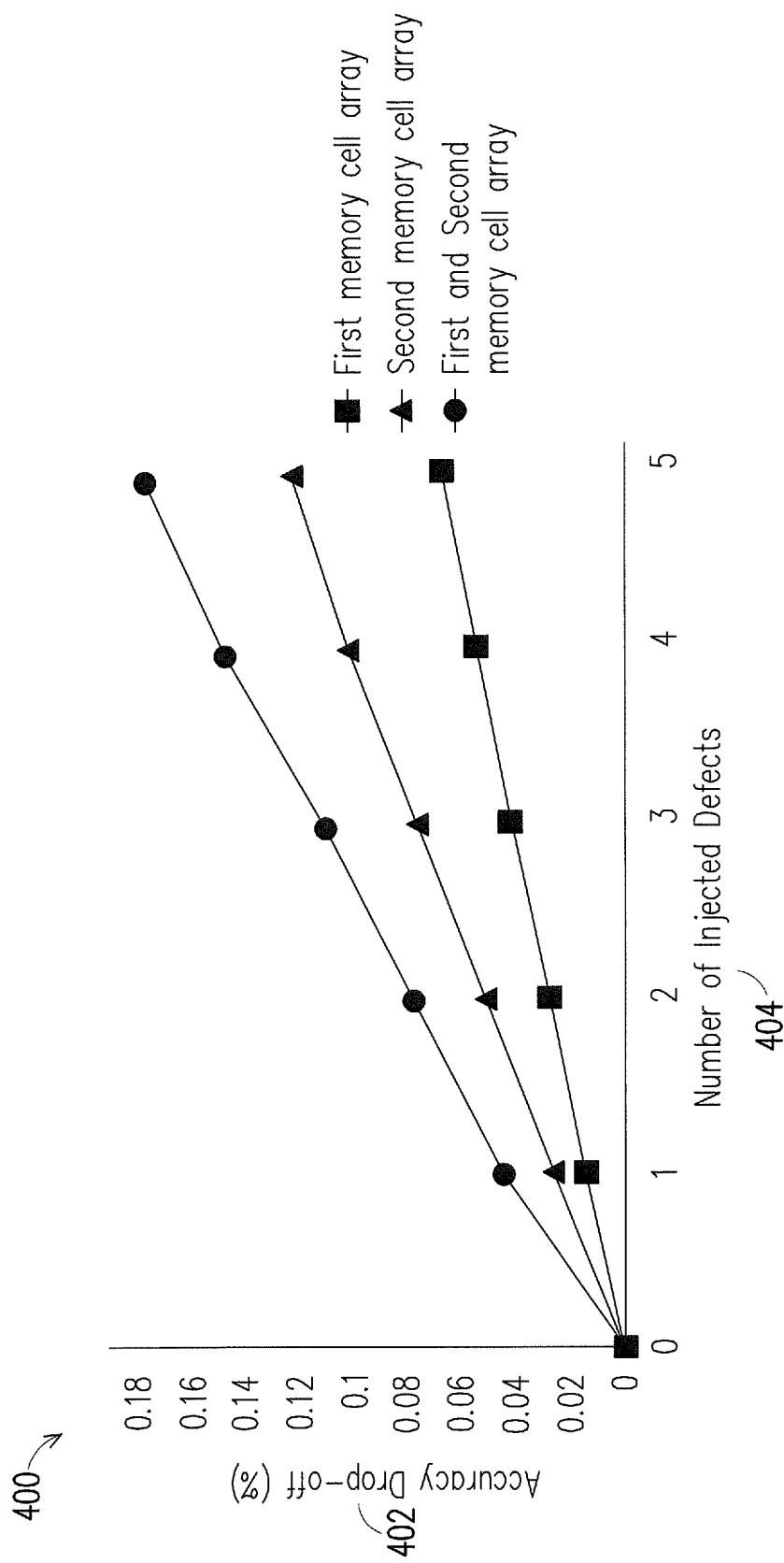
FIG. 4A illustrates a plot showing a relationship between a number of injected defects in the first and second memory cell arrays and an accuracy drop-off value, in accordance with some embodiments of the present disclosure.
Figure 4B:
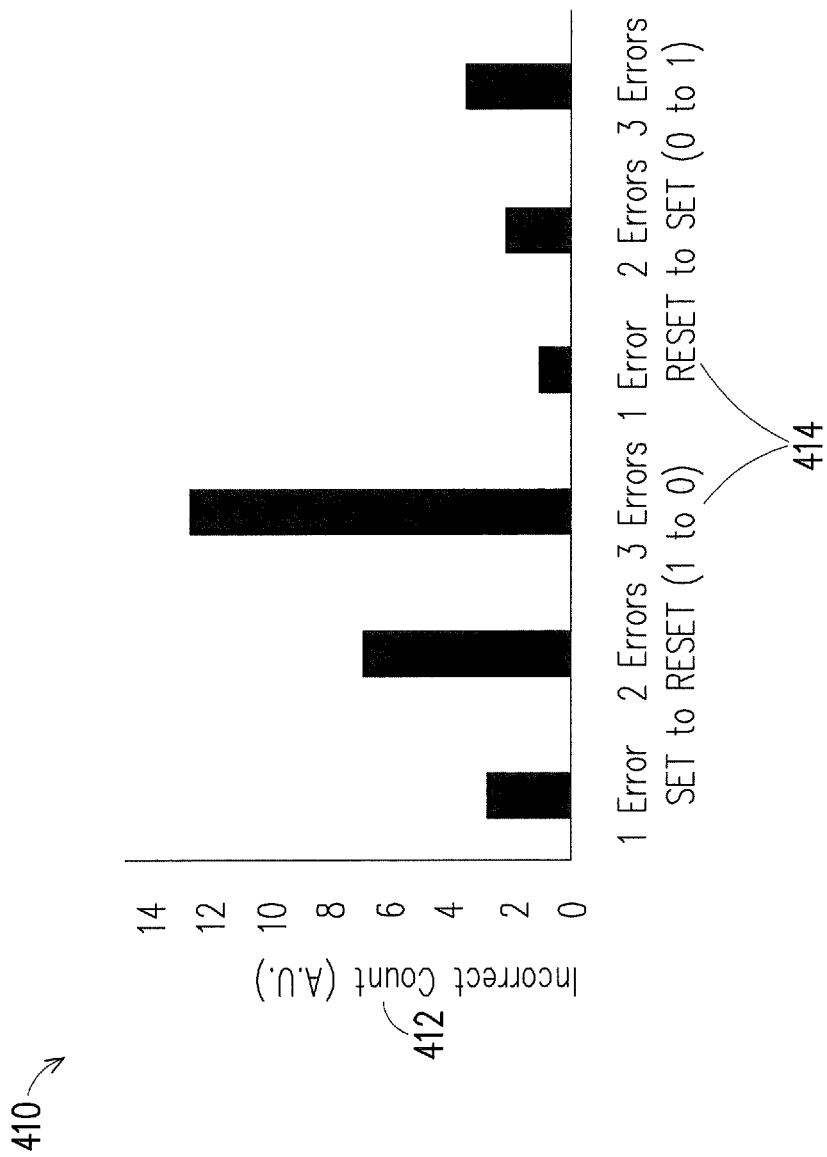
FIG. 4B illustrates a plot showing a relationship between an incorrect count and a number of errors, in accordance with some embodiments of the present disclosure.
Figure 4C:
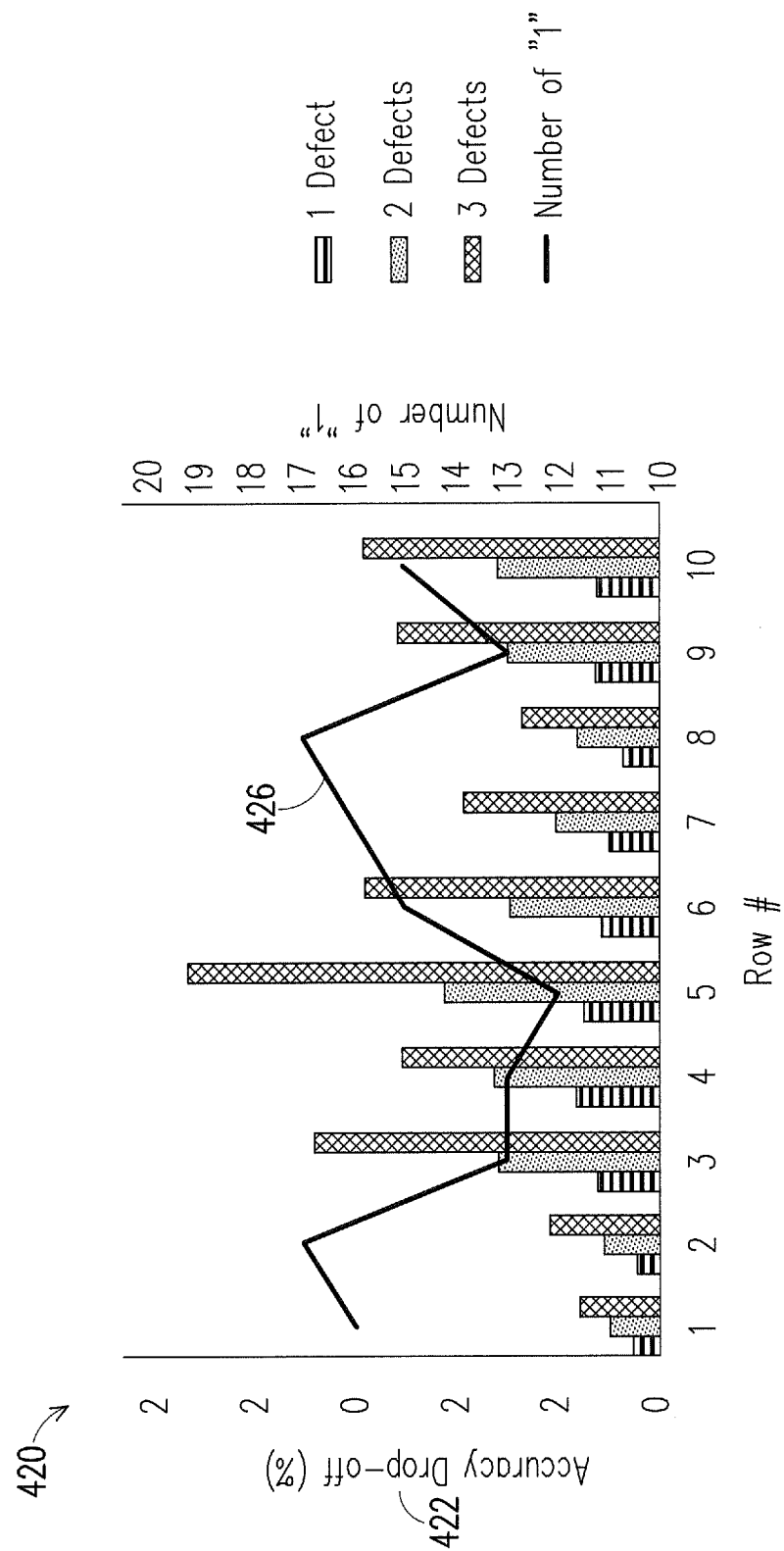
FIG. 4C illustrates a plot showing an accuracy drop-off value at each column of a second memory cell array corresponding to a second weight pattern $[X]_{10 \times 64}$, in accordance with some embodiments of the present disclosure.

FIGS. 4A-C illustrates simulation results using a network 100, in accordance with some embodiments of the present disclosure. In some embodiments, the network 100 comprises an input layer 112, a hidden layer 114, and an output layer 116, wherein the input layer 112 comprises N=64 neurons, the hidden layer 114 comprises M=64 neurons and the output layer 116 comprises P=10 neurons. Further, the network 100 comprises 2 weight patterns, i.e., a first weight pattern $[W]_{64 \times 64}$ and a second $[X]_{64 \times 10}$. In some embodiments, the first weight pattern is stored in a first memory cell array and the second weight pattern is stored in a second memory cell array. In some embodiments, the first memory cell array comprises an array of memory cells with a size of 64×64 and the second memory cell array comprises an array of memory cells with a size of 10×64.

FIG. 4A illustrates a plot 400 showing a relationship between a number of injected defects 404 in the first and second memory cell arrays and an accuracy drop-off value 402, in accordance with some embodiments of the present disclosure. In some embodiments, the accuracy drop-off value is determined by the equation below:

$$\text{Accuracy Dropoff} = \text{Accuracy before defect injection} - \text{Accuracy after defect injection}$$

wherein the Accuracy Dropoff 402 in % is a difference in accuracy before and after defective cells (hereinafter "defects") are introduced into the respective memory cell arrays. In some embodiments, the number of injected defects 404 per memory cell array are introduced manually to create a first defect pattern $[D_1]_{64 \times 64}$ of the first memory cell array and a second defect pattern $[D_2]_{10 \times 64}$ of the second memory cell array. In some embodiments, the defects are injected to the corresponding memory cell arrays after the corresponding weight patterns (e.g., $[W]_{N \times M}$ and $[X]_{P \times N}$) are determined through a training process, e.g., off-chip using a software with an assumption of defect-free memory cell arrays.

In the illustrated embodiments, the accuracy drop-off value 402 equals to 0.024% when 1 defect is injected to the first memory cell array; the accuracy drop-off value equals to 0.047%, when 2 defects is injected to the first memory cell array; the accuracy drop-off value equals to 0.070%, when 3 defects is injected to the first memory cell array; the accuracy drop-off value equals to 0.094%, when 4 defects is injected to the first memory cell array; and the accuracy drop-off value equals to 0.113%, when 5 defects is injected to the first memory cell array.

In the illustrated embodiments, the accuracy drop-off value equals to 0.012%, when 1 defect is injected to the second memory cell array; the accuracy drop-off value equals to 0.024%, when 2 defects is injected to the second memory cell array; the accuracy drop-off value equals to 0.036%, when 3 defects is injected to the second memory cell array; the accuracy drop-off value equals to 0.047%, when 4 defects is injected to the second memory cell array; and the accuracy drop-off value equals to 0.058%, when 5 defects is injected to the second memory cell array.

In the illustrated embodiments, the accuracy drop-off value equals to 0.042%, when 1 defect is injected to each of the first memory cell array and the second memory cell arrays; the accuracy drop-off value equals to 0.074%, when 2 defects are injected to each of the first memory cell array and the second memory cell arrays; the accuracy drop-off value equals to 0.104%, when 3 defects are injected to each of the first memory cell array and the second memory cell arrays; the accuracy drop-off value equals to 0.139%, when 4 defects are injected to each of the first memory cell array and the second memory cell arrays; and the accuracy drop-off value equals to 0.167%, when 5 defects are injected to each of the first memory cell array and the second memory cell arrays.

In the illustrated embodiments, the accuracy drop-off value caused by injected defects in the first memory cell array is more significant than that caused by the same number of injected defects in the second memory cell array. As illustrated in FIG. 4A, injecting defects to the first memory cell array can trigger more significant amount of accuracy drop off than that triggered by injecting defects to the second memory cell array. It is observed in the simulation results shown in FIG. 4A, the second memory cell array has a fewer number of neuron activation received from the output of the first memory cell array, e.g., number of "1"s at the output of the first memory cell array, so the number of defects in the second memory cell array that is capable of causing the same accuracy degradation is less. It should be noted that this trend is also applicable to other numbers of injected defects.

FIG. 4B illustrates a plot 410 showing a relationship between an incorrect count 412 and a number of errors 414, in accordance with some embodiments of the present disclosure. In some embodiments, the number of errors 414 is a number of test images that are incorrectly classified (e.g., an input image with a digit 8 is recognized and classified as a digit 6 after going through the entire artificial neural network.) In some embodiments, in order to introduce a 1-to-0 defect, the weight of 1 stored in a cell of a memory cell array is modified to 0. Similarly, in some other embodiments, in order to introduce a 0-to-1 defect, the weight of 0 stored in a cell of a memory cell array is modified to 1.

FIG. 4C illustrates a plot 420 showing an accuracy drop-off value 422 at each column of a second memory cell array corresponding to a second weight pattern 120 $[X]_{10\times64}$, in accordance with some embodiments of the present disclosure. Specifically, in this simulation, a curve 426 is a plot of a number of "1"s in each column of the second weight pattern 120 $[X]_{10\times64}$ versus a row #. In the illustrated embodiments, the numbers of "1"s in rows #0-#10 of the second weight pattern 120 $[X]_{10\times64}$ are 16, 17, 13, 13, 12, 15, 16, 17, 13, and 15, respectively. In the illustrated embodiment, the accuracy dropoff values in row 1 are 1.13, 2.27, and 3.79 at 1 defect, 2 defects and 3 defects, respectively; the accuracy dropoff values in row 2 are 1, 2.62, and 5.31 at 1 defect, 2 defects and 3 defects, respectively; the accuracy dropoff values in row 3 are 2.97, 7.90, and 16.94 at 1 defect, 2 defects and 3 defects, respectively; the accuracy dropoff values in row 4 are 4.02, 8.06, and 12.56 at 1 defect, 2 defects and 3 defects, respectively; the accuracy dropoff values in row 5 are 3.68, 10.52, and 23.14 at 1 defect, 2 defects and 3 defects, respectively; the accuracy dropoff values in row 6 are 2.83, 7.31, and 14.52 at 1 defect, 2 defects and 3 defects, respectively; the accuracy dropoff values in row 7 are 2.45, 5.06, and 9.54 at 1 defect, 2 defects and 3 defects, respectively; the accuracy dropvalues in row 8 are 1.76, 3.98, and 6.78 at 1 defect, 2 defects and 3 defects, respectively; the accuracy dropoff values in row 9 are 3.35, 7.42, and 12.77 at 1 defect, 2 defects and 3 defects, respectively; and the accuracy dropoff values in row 10 are 3.16, 7.94, and 14.52 at 1 defect, 2 defects and 3 defects, respectively.

In the illustrated embodiment, when the number of "1"s in a column of a weight pattern is large, the accuracy drop-off value 442 is small; and when the number of "1"s in a column of a weight pattern is small, the accuracy drop-off value 442 is large. As illustrated in this simulation results, the number of "1"s in a column of a weight pattern is correlated to the accuracy drop-off value 442. When the number of "1"s in a column of a weight pattern is larger, the accuracy drop-off value is smaller and therefore, the column with a larger number of "1"s in a weight pattern is thus tolerant or less sensitive to defects in a column of memory cells of a memory cell array. Similarly, when the number of "1"s in a column of a weight pattern is smaller, the accuracy drop off is larger, and therefore, the column with a smaller number of "1"s in a weight pattern is sensitive or less tolerant to defects in a column of memory cells of a memory cell array.

Figure 5A:
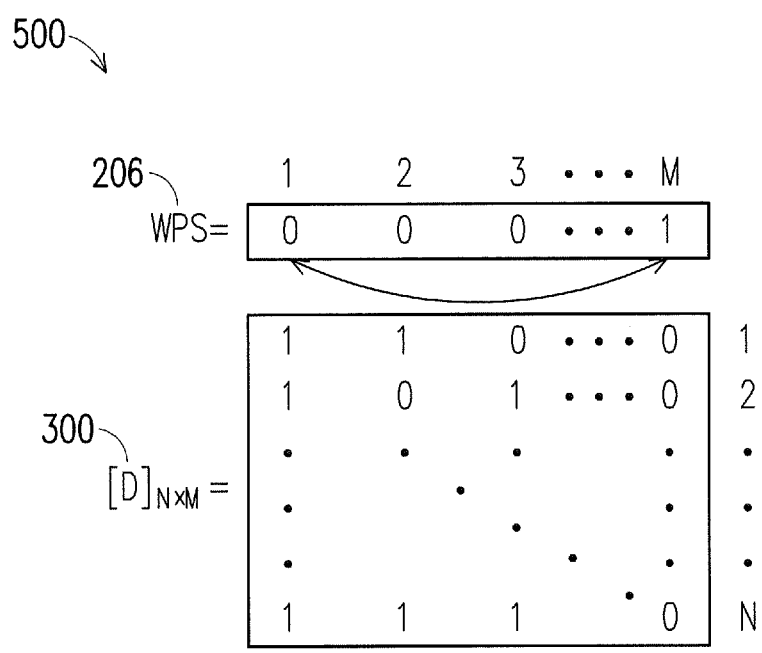
FIG. 5A illustrates a schematic for rearranging a weight pattern and input data on a memory cell array, in accordance with some embodiment of the present disclosure.

FIG. 5A illustrates a schematic 500 for rearranging a weight pattern and input data on a memory cell array, in accordance with some embodiment of the present disclosure. In some embodiments, the re-arrangement is determined according to the weight pattern sensitivity (WPS) 206 and a corresponding defect pattern 300 of the memory cell array. In the illustrated embodiments, the WPS 206 comprises 1 row and M columns and each column comprises a binary number indicating the relationship between a number of 1s in a column of a corresponding weight pattern and a predefined threshold value. For example, if the number of 1s in a column of the corresponding weight pattern is equal to or greater than the predefined threshold value, the corresponding element in the WPS 206 is equal to 1; and if the number of is in a column of the corresponding weight pattern is less than the predefined threshold value, the corresponding element in the WPS 206 is equal to 0. In the illustrated embodiments, the last column of WPS 206 is 1 and the first column of the WPS 206 is 0. In illustrated embodiments, the defect pattern 300 illustrates a number of defective cells (i.e., defects) in a memory cell array. In the illustrated embodiments, the first column in the memory cell array is defect-free and the last column of the memory cell array contains the greatest number of defects (e.g., 2 defects). According to the WPS 206 and the detect pattern 300, column 1 of the memory cell array receives corresponding weights and input data that are originally designated for column M of the memory cell array; and column M of the memory cell array receives corresponding weights and inputs data that are originally designated for column 1 of the memory cell array so as to employ the column with the least number of defects for the storage of the most defect sensitive weight and the corresponding input data.

FIG. 5B illustrates a schematic 510 for a re-arrangement of a weight pattern and input data on a memory cell array, in accordance with some embodiment of the present disclosure. In some embodiments, the re-arrangement is determined according to the weight pattern sensitivity (WPS) 206 and a corresponding defect pattern 300. In the illustrated embodiments, the WPS 206 comprises 1 row and M columns and each column comprises non-binary numbers. In some embodiments, values in the WPS 206 is determined by comparing the number of positive weights in a column of a weight pattern against multi-levels of thresholds. For example, when the number of positive weights in a column of a weight pattern is equal to or greater than 0 and smaller than 5 and the WPS value for the column is 0; when the number of positive weights in a column of a weight pattern is equal to or greater than 5 and smaller than 10, the WPS value of the column is 1; when the number of positive weights in a column of a weight pattern is equal to or greater than 10 and smaller than 15, the WPS value of the column is 2; and when the number of positive weights in a column of a weight pattern is equal to or greater than 15 and smaller than the size of a column (e.g., N in FIG. 2), the WPS value of the column is 3.

In illustrated embodiments, the defect pattern 300 illustrates a map of defective cells (i.e., defects) in a memory cell array. In the illustrated embodiments, a failure bit count (FBC) 512 of each column which is the number of defects of each column, can be determined according to the given defect pattern 300. In the illustrated embodiment, the first column of the memory cell array comprises 0 defect, the second column of the memory cell array comprises 2 defects, the third column of the memory cell array comprises 1 defect, . . . , the M−2 column of the memory cell array comprises 0 defect, the M−1 column of the memory cell array comprises 2 defects, and the M column of the memory cell array comprises 1 defect. In the illustrated embodiment, a statistics severity (SS) 514 is determined as a product of the FBC 512 and the WPS 206.

According to the SS 514, column 1 of the memory cell array receives corresponding weights and input data that are originally designated for column M−1 of the memory cell array; and column M−1 of the memory cell array receives corresponding weights and inputs data that are originally designated for column 1 of the memory cell array. Similarly, column 2 of the memory cell array receives corresponding weights and input data that are originally designated for column M−2 of the memory cell array; and column M−2 of the memory cell array receives corresponding weights and inputs data that are originally designated for column 2 of the memory cell array.

In some embodiments, when there is not enough good columns to swap with, we will need to start from one direction (e.g. left to right, low address to high address, low IO number to high IO number, etc).

It should be noted FIGS. 5A-5B are examples and are not intended to be limiting. Different numbers of defects, different values of weight patterns, different positions and numbers of columns of a memory cell array that need to be rearranged are within the scope of this invention.

Figure 6A:
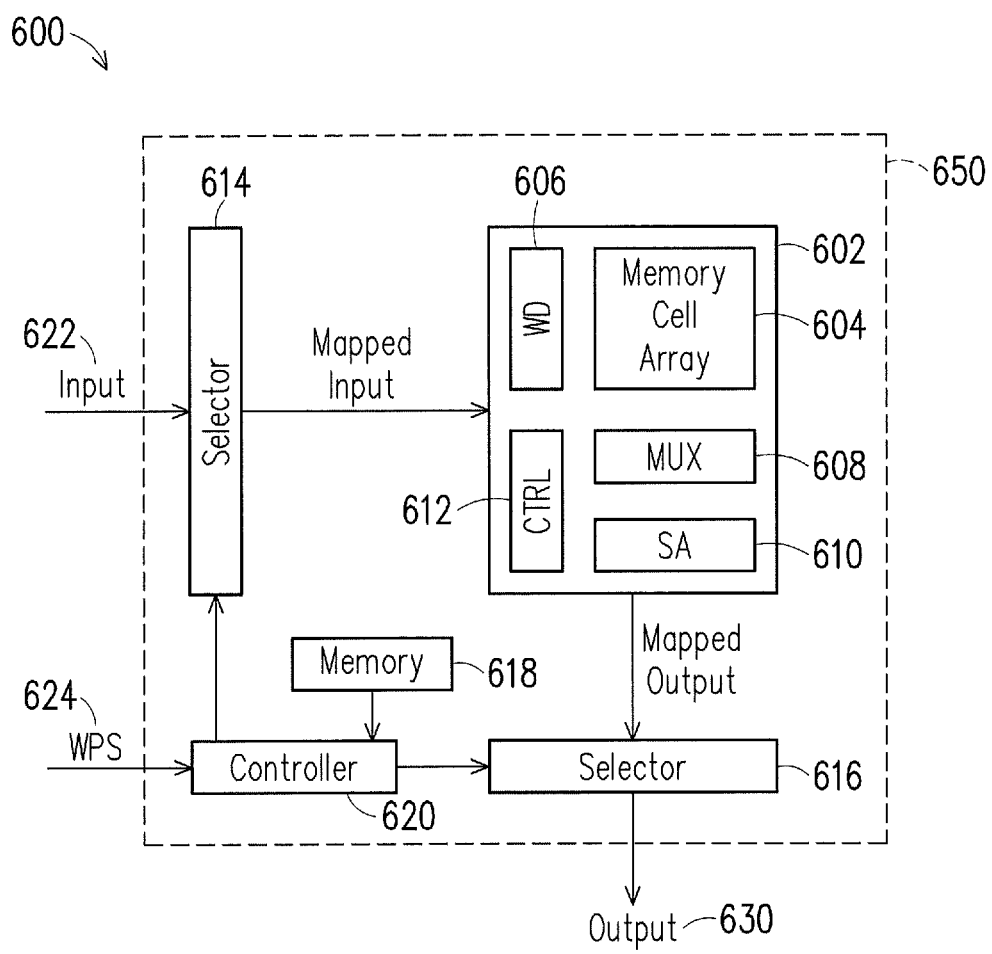
FIG. 6A illustrates a block diagram of a system for determining values on neurons on a hidden layer of a network, in accordance with some embodiments of the present disclosure.

FIG. 6A illustrates a block diagram of a system 600 for determining values on neurons 108 on a hidden layer 114 of a network 100, in accordance with some embodiments of the present disclosure. It is noted that the system 600 is merely an example, and is not intended to limit the present disclosure. Accordingly, it is understood that additional functional blocks may be provided in or coupled to the system 600, and that some other functional blocks may only be briefly described herein.

In the illustrated embodiment of FIG. 6A, the system 600 comprises a neural network macro 650, wherein the neural network macro 650 comprises a memory macro 602. In some embodiments, the memory macro 602 comprises a memory cell array 604, which comprises a plurality of memory cells. In some embodiments, the plurality of memory cells is arranged in a column-row configuration in which each column has a memory line (BL) and a memory line bar (BLB), each row has a word line (WL). More specifically, the BL and BLB of each column are respectively coupled to a plurality of memory cells that are disposed in that column, and each memory cell in that column is arranged on a different row and coupled to a respective (different) WL. That is, each memory cell of the memory cell array 604 is coupled to a BL of a column of the memory cell array 604, a BLB of the column of the memory cell array 604, and a WL of a row of the memory cell array 604. In some embodiments, the BL's and BLB's are arranged in parallel vertically and the WL's are arranged in parallel horizontally (i.e., perpendicular to the BL's and BLB's). In some embodiments, WL for each row of memory cells in the memory cell array 604 are connected together.

In some embodiments, each of the memory cells of the memory cell array 604 comprises at least one transistor. In some other embodiments, each of the plurality of memory cells of the memory cell array 604 may comprises one of the following: a memrister, resistive random access memory (ReRAM, RRAM), phase change random access memory (PCRAM, PCM), magnetoresistive random access memory (MRAM), conductive bridge random access memory (CBRAM), floating gate flash memory (FLASH), and static random access memory (SRAM).

In some embodiments, the memory macro 602 further comprises a write driver (WD) 606, a multiplexer (MUX) 608, a sense amplifier (SA) 610 and a control circuit 612. In some embodiments, the WD 606 is configured to provide a necessary voltage and/or current required to program the memory cell array 604. In some embodiments, the MUX 608 is configured to select a path to forward input signal to the output. In some embodiments, the SA 610 is configured to compare voltages or currents generated during a read operation with a pre-defined threshold value.

In some embodiments, the control circuit 612 is a representative device and may comprise a processor, a memory, an input/output interface, a communications interface, and a system bus. The processor may comprise any processing circuitry operative to control the operations and performance of the control circuit 612 of the memory macro 602. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the control circuit 612 of the memory macro 602.

For example, the memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C #, Python, Objective-C, Visual Basic, or .NET programming. In some embodiments a compiler or interpreter is comprised to convert the instruction set into machine executable code for execution by the processor.

In some embodiments, the I/O interface may comprise any suitable mechanism or component to at least enable a user to provide input (i.e., test/request and or test/normal modes, etc.) to the control circuit 612 of the memory macro 602 and the control circuit 612 of the memory macro 602 to provide output control to the other components of the memory macro 602 (e.g., the memory cell array 604, the WD 606, the MUX 608 and the SA 610).

In some embodiments, the neural network macro 650 further comprises 2 selectors 614/616. In some embodiments, the selector 614 and 616 each is configured to swap the input to form a mapped input for the memory cell array 604 according to a re-arrangement as discussed in FIGS. 5A and 5B.

In some embodiments, the neural network macro 650 further comprises a memory 618. In some embodiments, the memory may comprise any machine-readable or computer-readable media capable of storing data, including both volatile/non-volatile memory and removable/non-removable memory. The memory may comprise at least one non-volatile memory unit. For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory 618 contains a defect pattern $[D_1]_{N \times M}$ as discussed in FIGS. 3A-3B, in the form of a file or any acceptable form of machine-readable instructions. In some embodiments, the memory 618 comprises address of the corresponding defective memory cells in the memory cell array 604. In some embodiments, the defect pattern pre-stored in the memory 618 is determined by programming measuring the memory cell array 604 during a manufacturing process.

In some embodiments, the neural network macro 650 further comprises a controller 620. In some embodiments, the controller 620 is configured to receive the defect pattern from the memory 618 and a weight pattern sensitivity (WPS) 624. In some embodiments, the controller 620 is further configured to determine a swapping decision based on the defect pattern 300 and the WPS 206 so as to instruct the selectors 614/616 to perform an I/O swap. In some embodiments, the selectors 614/616 and the controller 620 can be configured outside of a system interface 650. In some embodiments, the outside of the system interface 650 further comprises at least one of the following: a processing unit, a sensing unit, and a power regulation unit, all of which are not shown.

Figure 6B:
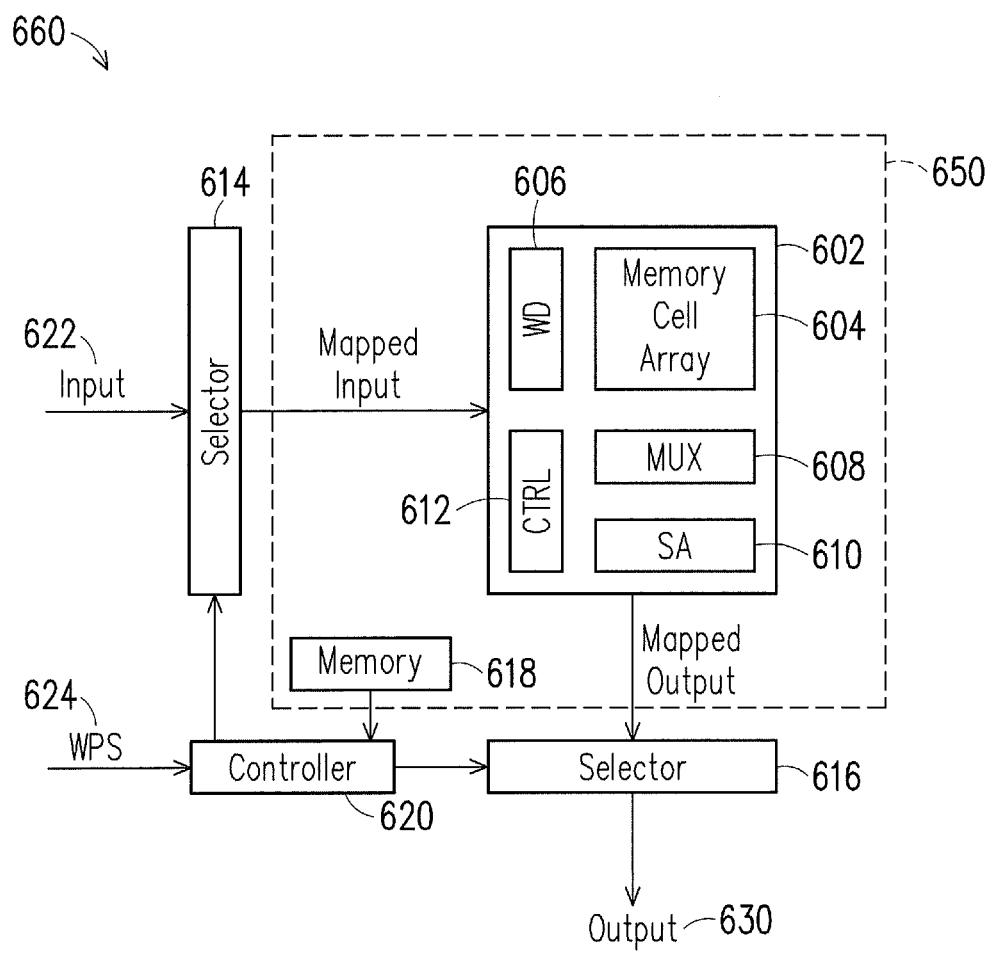
FIG. 6B illustrates a block diagram of a system for determining values on neurons on a hidden layer of a network, in accordance with some embodiments of the present disclosure.

FIG. 6B illustrates a block diagram of a system 660 for determining values on neurons 108 on a hidden layer 114 of a network 100, in accordance with some embodiments of the present disclosure. It is noted that the system 660 is merely an example, and is not intended to limit the present disclosure. Accordingly, it is understood that additional functional blocks may be provided in or coupled to the system 660, and that some other functional blocks may only be briefly described herein.

In the illustrated embodiment of FIG. 6B, the system 660 comprises a neural network macro 650, wherein the neural network 650 comprises a memory macro 602 and a memory 618. In some embodiments, the memory macro 602 comprises a memory cell array 604, which comprises a plurality of memory cells. In some embodiments, the plurality of memory cells is arranged in a column-row configuration in which each column has a memory line (BL) and a memory line bar (BLB), each row has a word line (WL). More specifically, the BL and BLB of each column are respectively coupled to a plurality of memory cells that are disposed in that column, and each memory cell in that column is arranged on a different row and coupled to a respective (different) WL. That is, each memory cell of the memory cell array 604 is coupled to a BL of a column of the memory cell array 604, a BLB of the column of the memory cell array 604, and a WL of a row of the memory cell array 604. In some embodiments, the BL's and BLB's are arranged in parallel vertically and the WL's are arranged in parallel horizontally (i.e., perpendicular to the BL's and BLB's). In some embodiments, WL for each row of memory cells in the memory cell array 604 are connected together.

In some embodiments, each of the memory cells of the memory cell array 604 comprises at least one transistor. In some other embodiments, each of the plurality of memory cells of the memory cell array 604 may comprises one of the following: a memrister, resistive random access memory (ReRAM, RRAM), phase change random access memory (PCRAM, PCM), magnetoresistive random access memory (MRAM), conductive bridge random access memory (CBRAM), floating gate flash memory (FLASH), and static random access memory (SRAM).

In some embodiments, the memory macro 602 further comprises a write driver (WD) 606, a multiplexer (MUX) 608, a sense amplifier (SA) 610 and a control circuit 612. In some embodiments, the WD 606 is configured to provide a necessary voltage and/or current required to program the memory cell array 604. In some embodiments, the MUX 608 is configured to select a path to forward input signal to the output. In some embodiments, the SA 610 is configured to compare voltages or currents generated during a read operation with a pre-defined threshold value.

In some embodiments, the control circuit 612 is a representative device and may comprise a processor, a memory, an input/output interface, a communications interface, and a system bus. The processor may comprise any processing circuitry operative to control the operations and performance of the control circuit 612 of the memory macro 602. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the control circuit 612 of the memory macro 602.

For example, the memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the memory 618 may comprise any machine-readable or computer-readable media capable of storing data, including both volatile/non-volatile memory and removable/non-removable memory. The memory 618 may comprise at least one non-volatile memory unit. For example, the memory 618 may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory 618 contains a defect pattern $[D_1]_{N \times M}$ as discussed in FIGS. 3A-3B, in the form of a file or any acceptable form of machine-readable instructions. In some embodiments, the memory 618 comprises address of the corresponding defective memory cells in the memory cell array 604. In some embodiments, the defect pattern pre-stored in the memory 618 is determined by programming measuring the memory cell array 604 during a manufacturing process.

In some embodiments, the network macro 660 is coupled to a first selector 614, a second selector 616 and a controller 620. In some embodiments, the system 660 further comprises 2 selectors 614/616. In some embodiments, the selector 614 and 616 each is configured to swap the input to form a mapped input for the memory cell array 604 according to a re-arrangement as discussed in FIGS. 5A and 5B.

In some embodiments, the controller 620 is configured to receive the defect pattern from the memory 618 and a weight pattern sensitivity (WPS) 624. In some embodiments, the controller 620 is further configured to determine a swapping decision based on the defect pattern 300 and the WPS 206 so as to instruct the selectors 614/616 to perform an I/O swap. In some embodiments, the system 660 further comprises at least one of the following: a processing unit, a sensing unit, and a power regulation unit, all of which are not shown and are located outside of the neural network macro 650.

Figure 7A:
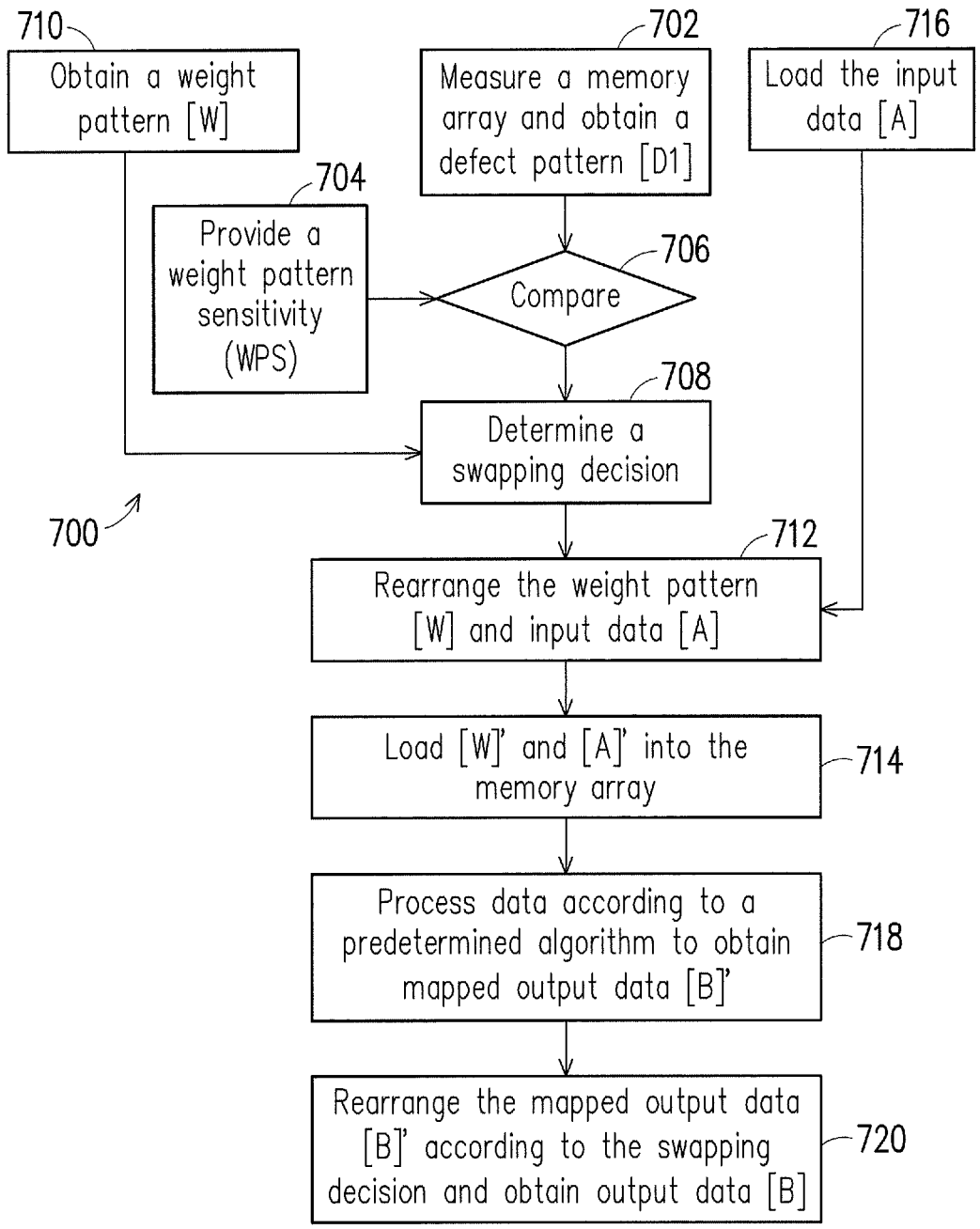
FIG. 7A illustrates a flow chart of a method for performing a calculation of values on each of the neurons on a hidden layer of a network using a neural network macro, in accordance with some embodiments of the present disclosure.

FIG. 7A illustrates a flow chart of a method 700 for performing a calculation of values on each of the neurons 108 on a hidden layer 114 of a network 100 using a neural network macro 600 or 660, in accordance with some embodiments of the present disclosure. In some embodiments, the operations of method 700 are performed by the respective components illustrated in FIGS. 1, 3, 5, and 6A-6B. For purposes of discussion, the following embodiment of the method 700 will be described in conjunction with FIGS. 1, 3, 5, and 6A-6B. The illustrated embodiment of the method 700 is merely an example for performing a weight rearrangement according to a weight pattern sensitivity (WPS) of a weight pattern. Therefore, it should be understood that any of a variety of operations may be omitted, re-sequenced, and/or added while remaining within the scope of the present disclosure.

The method 700 starts with operation 702, in which a defect pattern $[D_1]_{N \times M}$ 300 of a memory cell array 604 is loaded to a controller 620 according to some embodiments. In some embodiments, the defect pattern $[D_1]_{N \times M}$ 300 contains addresses of defective memory cells in the memory cell array 604. In some embodiments, a defect pattern indicator (DPI) 306 can be loaded into the controller 620. In some embodiments, the DPI 306 comprises 1 row and m columns, wherein $m = \log_2 M$, M is the number of columns in the corresponding defect pattern $[D_1]_{N \times M}$ 300. In some embodiments, when the number of defective memory cells in a column 302-j of the defect pattern $[D]_{N \times M}$ 300 is equal to or greater than a predefined threshold value, the DPI 306 is determined as the address of the column 302-j. In some other embodiments, the DPI 306 can also comprises N rows and 1 column with respect to the corresponding defect pattern $[D_1]_{N \times M}$ 300, which comprises N rows and M columns. In some embodiments, when the number of defective memory cells in a column 302-j of the defect pattern $[D_1]_{N \times M}$ 300 is equal to or greater than a predefined threshold value, the value of the dj in the DPI 306 is determined as "0"; and when the number of defective memory cells in a column 302-j of the defect pattern $[D_1]_{N \times M}$ 300 is less than the predetermined threshold value, the corresponding $d_j$ in the DPI 306 is determined as "1". In some embodiments, the defect pattern $[D_1]_{N \times M}$ 300 or a DPI 306 can be stored in a memory 618.

In some embodiments, prior to the operation 702, the defect pattern $[D_1]_{N \times M}$ can be determined by measuring the memory cell array 604. In some embodiments, the operation 702 further comprises writing a preconfigured logical state (e.g., "1") to each of a plurality of memory cells in the memory cell array 604 and measure a stored logical state. When the stored logical state in a memory cell is consistent with the preconfigured logical state, e.g., both are "1", the memory cell is stable and not defective. When the stored logical state in a memory cell is different from the preconfigured logical state, e.g., the stored logical state is "0", the memory cell is determined as defective and thus, the memory cell is a defect in the memory cell array 604. Specifically, the memory cell is "1" to "0" defective. Similarly, when a "0" is written into a memory cell and the stored logical state is "1", then the memory cell is also determined as "0" to "1" defective. In some embodiments, the operation 702 can be performed by a neural network system or a memory manufacture during a fabrication process.

The method 700 continues with operation 704, in which a weight pattern sensitivity (WPS) 200 is loaded to the controller 620 according to some embodiments. In the illustrated embodiments, the WPS 200 comprises 1 row and M columns. In some embodiments, the WPS 200 of the corresponding weight pattern 118 $[W]_{N \times M}$ can be determined according to a number of "0" or "1" in a column 202. For example, when a number of "1"s in a column 202-j is equal to or greater than a predefined threshold value, the $S_j$ in the WPS 200 is determined as 1, wherein $j \leq N$ and is a positive integer. Similarly, when a number of "1"s in a column 202-j is less than the predefined threshold value, the $S_j$ in the WPS 200 is determined as "0". In some embodiments, there is one WPS 200 for a corresponding weight pattern 118 $[W]_{N \times M}$. In some embodiments, the WPS 200 can be obtained and/or adjusted by a user externally.

In some embodiments, values in the WPS 200 is determined by comparing the number of positive weights in a column of a weight pattern against multi-levels of thresholds. For example, when the number of positive weights in a column of a weight pattern is equal to or greater than 0 and smaller than 5 and the WPS' value for the column is 0; when the number of positive weights in a column of a weight pattern is equal to or greater than 5 and smaller than 10, the WPS value of the column is 1; when the number of positive weights in a column of a weight pattern is equal to or greater than 10 and smaller than 15, the WPS value of the column is 2; and when the number of positive weights in a column of a weight pattern is equal to or greater than 15 and smaller than the size of a column (e.g., N in FIG. 2), the WPS value of the column is 3.

The method 700 continues with operation 706, in which the WPS 200 and the defect pattern $[D_1]_{N \times M}$ 300 of a corresponding weight pattern 118 $[W]_{N \times M}$ are compared by the controller 620 according to some embodiments. In some other embodiments, the WPS 200 and the DPI 306 are compared by the controller 620. In some other embodiments, a product of the WPS 200 and a number of defects in each column of the defect pattern $[D_1]_{N \times M}$ 300 is determined.

The method 700 continues with operation 708, in which a swapping decision is determined by the controller 620 according to some embodiments. In some embodiments, a column in the memory cell array 604 with a highest number of defects and a highest number of 1s in a corresponding weight pattern is determined to receive weights and input data that are originally stored on a column of the memory cell array 604 with a lowest number of defects and a lowest number of 1s in the corresponding weight pattern. In some other embodiments, a statistic severity (SS) 514 is determined according to the product of the of the WPS 200 and the number of defects in each column of the defect pattern $[D_1]_{N \times M}$ 300. In some embodiments, a column of the memory cell array 604 of the memory cell array with a highest number in the SS 514 is determined to receive weights and input data that are originally stored on a column of the memory cell array 604 with a lowers number in the SS 514.

The method 700 continues with operation 710, in which a weight pattern 118 $[W]_{N \times M}$ is loaded in to the neural network macro 650 as an input 622 according to some embodiments. In some embodiments, the weight pattern 118 $[W]_{N \times M}$ is determined through a training process on using a software without considering the memory cell array 604 and their potential defects caused in respective fabrication processes. In some embodiments, the weight pattern 118 [W]$_{N \times M}$ is loaded in to the neural network macro 650 as an input 622 through a selector 614, which is located out of the neural network macro 650.

The method 700 continues with operation 712 in which the weight pattern 118 [W]$_{N \times M}$ is rearranged to determine a rearranged weight pattern [W]'$_{N \times M}$ by swapping I/O's according to some embodiments. In some embodiments, the rearranged weight pattern [W]'$_{N \times M}$ is determined according to the swapping decision determined in the operation 708. For example, a column 202-a of the weight pattern 118 [W]$_{N \times M}$ at the input corresponding to the column in the memory cell array 604 with a highest number of defects and a highest number of 1s in the corresponding weight pattern 118 [W]$_{N \times M}$ switches with a column 202-b of the weight pattern 118 [W]$_{N \times M}$ at the input corresponding to the column of the memory cell array 604 with a lowest number of defects and a lowest number of 1s in the corresponding weight pattern 118 [W]$_{N \times M}$, wherein a and b are positive integer and are both smaller than M. In some embodiments, this rearrangement process can be described in FIG. 7B below.

Figure 7B:
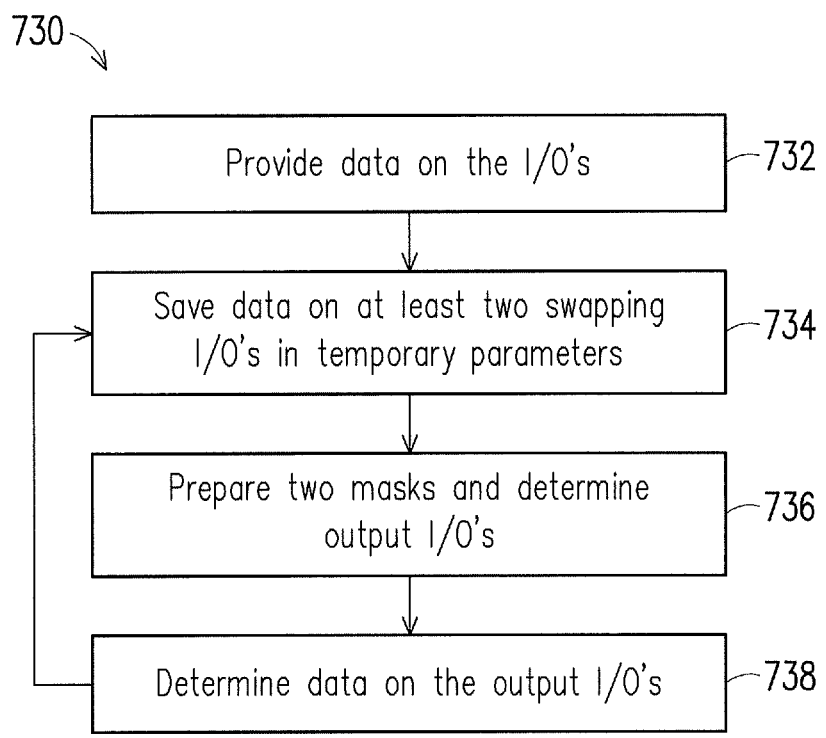
FIG. 7B illustrates a flow chart of a method 730 for swapping I/O's by a state machine in a selector 614, in accordance with some embodiments of the present disclosure.

FIG. 7B illustrates a flow chart of a method 730 for swapping I/O's by a state machine in a selector 614, in accordance with some embodiments of the present disclosure. The method 730 starts with operation 732 in which data is provided at input I/O's of the selector 614 according to some embodiments. In some embodiments, corresponding weight pattern 118 [W]$_{N \times M}$ is provided at the input I/O's of the selector 614. In some embodiments, the selector 614 is located inside a neural network macro 650. In some embodiments, the selector 614 can be selected and implemented as needed by users. In some embodiments, the data can be one of the following: the weight pattern 118 [W]$_{N \times M}$ and data input [A], which is discussed in detail further below.

The method 730 continues with operation 734 in which data in at least two swapping I/O's is stored according to some embodiments. In some embodiments, the swapping I/O's are input I/O's corresponding to two columns in the weight pattern 118 [W]$_{N \times M}$, e.g., columns 202-a and 202-b. In some embodiments, data in columns 202-a and 202-b are stored in two respective temporary parameters.

The method 730 continues with operation 736 in which two mask arrays are prepared and output I/O's are determined according to some embodiments. In some embodiments, the two mask arrays, including an "OR_mask" and an "AND_mask", are generated by a selector 614 based on the data content of the swapping I/O's at the input 622, e.g., the column 202-a and column 202-b of the weight pattern 118 [W]$_{N \times M}$. In some embodiments, the output PO's of the selector 614 are determined by the operation below:

Output I/O's=input I/O's|OR_mask & AND_mask", wherein "|" is the bit-wise OR operator and "&" is the bit-wise AND operator.

The method 730 continues with operation 738 in which data on the output I/O's is determined according to some embodiments. In some embodiments, a rearranged weight pattern [W]'$_{N \times M}$ is determined according to the weight pattern [W]$_{N \times M}$, and the two mask arrays. For example, data in the column 202-a stored in a first temporary parameter is loaded to the output I/O corresponding to the column 202-B and data in the column 202-b stored in a second temporary parameter is loaded into the output I/O corresponding to the column 202-a.

In some embodiments, the method 730 continues with operation 734 according to some embodiments.

FIG. 7C illustrates a table 740 with exemplary data in a swapping process presented in FIG. 7B, in accordance with some embodiments of the present disclosure. In the illustrated embodiments, the input I/O's comprises 8 bits, which are 01011010, and the third and the fifth are determined to be swapped according to the process described in FIG. 7A. In some embodiments, the third I/O comprises data 011 and saved on a first temporary parameter (e.g., temp 1) and the fifth I/O comprises data 101 and stored on a second temporary parameter (i.e., temp 2). In some embodiments, a first mask (i.e., OR_mask) comprises 8 bits and the third bit is 1, while all other bits of the second mask are 0; a second mask (i.e., AND_mask) also comprises 8 bits and the fifth bit is 0, while all the other bits of the second mask are 1. After operation, the output I/O's comprises 8 bits, which are 01110010. Further, the third I/O in the output I/O outputs data 101 and the fifth I/O in the output I/O outputs data 011.

The method 700 continues with operation 714 in which the rearranged weight pattern [W]'$_{N \times M}$ is loaded to the memory cell array 604 according to some embodiments. In some embodiments, the rearranged weight pattern [W]'$_{N \times M}$ is written by storing a "0" or a "1" in corresponding memory cells of the memory cell array 604. In some embodiments, the column of the memory cell array 604 with a highest number of defects and a highest number of 1s in the corresponding weight pattern receives the weights that are originally stored in the column of the memory cell array 604 with a lowest number of defects and a lowest number of 1s in the corresponding weight pattern. Similarly, the column of the memory cell array 604 with a lowest number of defects and a lowest number of 1s in the corresponding weight pattern receives the weights that are originally stored in the column of the memory cell array 604 with a highest number of defects and a highest number of is in the corresponding weight pattern. All the other columns receive their corresponding weights without further modification.

The method 700 continues with operation 716 in which the values on the neurons 106 of the input layer 112 are loaded to the neural network macro 600 according to some embodiments. In some embodiments, the values on the neurons 106 of the input layer 112 are input data [A]$_{M \times 1}$. In some embodiments, [A]$_{M \times 1}$ can be loaded from an output of a previous process.

The method 700 continues with operation 712 in which the input data [A]$_{M \times 1}$ is rearranged to determine a rearranged input data [A]'$_{M \times 1}$ according to some embodiments. In some embodiments, the rearranged input data [A]'$_{M \times 1}$ is determined according to the swapping decision determined in the operation 708. In some embodiments, the rearranged input data [A]'$_{M \times 1}$ is then transposed from a column to a row ([A]'$_{1 \times M}$) prior to load to the memory cell array 604. In some embodiments, the rearranged input data [A]'$_{M \times 1}$ is obtained according to the method 730 discussed above in FIG. 7B.

The method 700 continues with operation 714 in which the rearranged and transposed input data [A]'$_{1 \times M}$ is loaded into the memory cell array 604 according to some embodiments.

The method 700 continues with operation 718 in which a mapped output data [B]'$_{N \times M}$ is determined according to some embodiments. In some embodiments, the mapped output data [B]'$_{N \times M}$ is determined according to a predetermined algorithm. In some embodiments, the rearranged input data [A]'$_{1 \times M}$ and the rearranged weight pattern [W]'$_{N \times M}$ are processed in corresponding memory cells through in-bit multiplication.

The method 700 continues with operation 720 in which an output data [B]$_{N \times M}$ is determined according to some embodiments. In some embodiments, the output data $[B]_{N \times M}$ is determined through a reverse arrangement of the mapped output data $[B]'_{N \times M}$ according to the swapping decision. Continue with the example discussed in FIG. 7B, output data on column 202-*a* of the memory cell array is then output on output I/O of the corresponding column 202-*b*. Similarly, output data on column 202-*b* of the memory cell array is then output on output I/O of the corresponding column 202-*b*. In some embodiments, the swapping decision is received from the controller 620 by a selector 616. In some embodiments, the operation 720 is performed by the selector 616 at the output.

Figure 8:
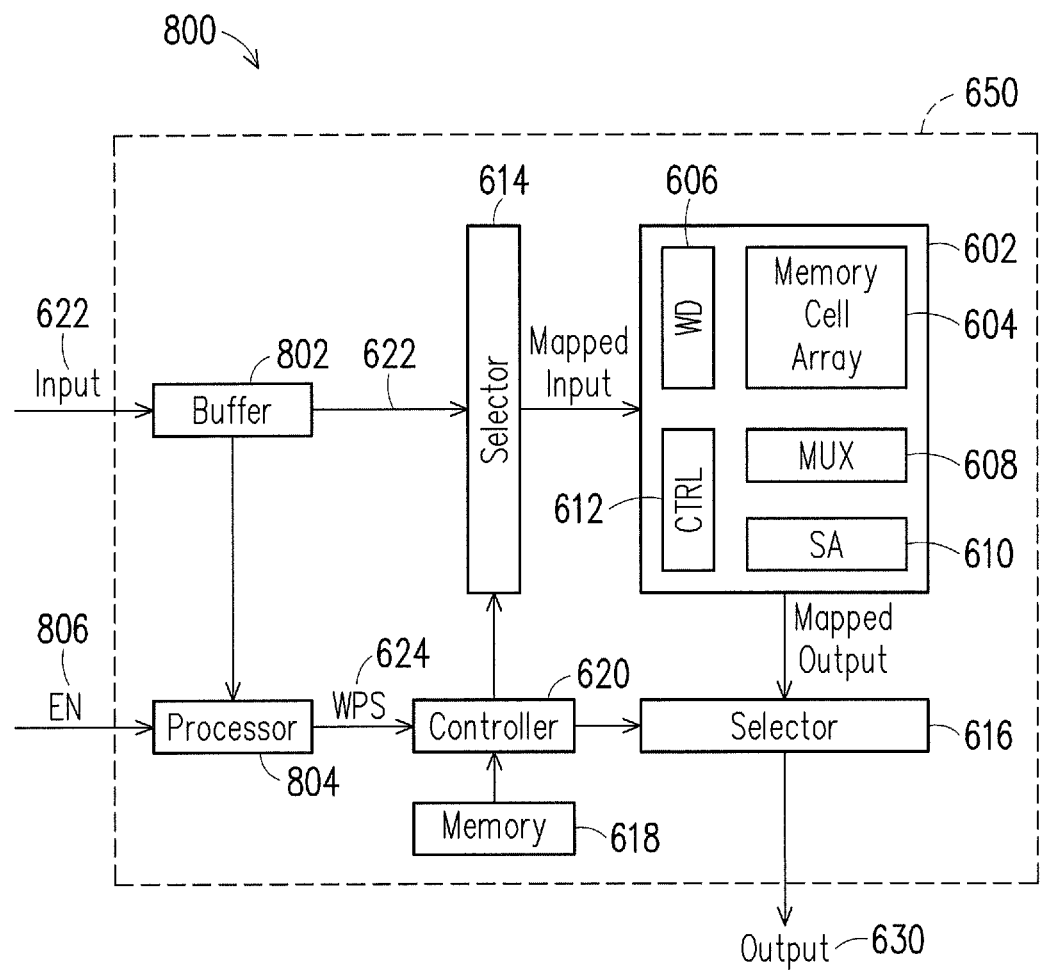
FIG. 8 illustrates a block diagram of a system for determining values on neurons on a hidden layer of a network, in accordance with some embodiments of the present disclosure.

FIG. 8 illustrates a block diagram of a system 800 for determining values on neurons 108 on a hidden layer 114 of a network 100, in accordance with some embodiments of the present disclosure. It is noted that the system 800 is merely an example, and is not intended to limit the present disclosure. Accordingly, it is understood that additional functional blocks may be provided in or coupled to the system 800, and that some other functional blocks may only be briefly described herein.

In the illustrated embodiment of FIG. 8, the system 800 comprises a neural network macro 650, wherein the neural network macro 650 comprises a memory macro 602. In some embodiments, the memory macro 602 comprises a memory cell array 604, which comprises a plurality of memory cells. In some embodiments, the plurality of memory cells is arranged in a column-row configuration in which each column has a memory line (BL) and a memory line bar (BLB), each row has a word line (WL). More specifically, the BL and BLB of each column are respectively coupled to a plurality of memory cells that are disposed in that column, and each memory cell in that column is arranged on a different row and coupled to a respective (different) WL. That is, each memory cell of the memory cell array 604 is coupled to a BL of a column of the memory cell array 604, a BLB of the column of the memory cell array 604, and a WL of a row of the memory cell array 604. In some embodiments, the BL's and BLB's are arranged in parallel vertically and the WL's are arranged in parallel horizontally (i.e., perpendicular to the BL's and BLB's). In some embodiments, WL for each row of memory cells in the memory cell array 604 are connected together.

In some embodiments, each of the memory cells of the memory cell array 604 comprises at least one transistor. In some other embodiments, each of the plurality of memory cells of the memory cell array 604 may comprises one of the following: a memristor, resistive random access memory (ReRAM, RRAM), phase change random access memory (PCRAM, PCM), magnetoresistive random access memory (MRAM), conductive bridge random access memory (CBRAM), floating gate flash memory (FLASH), and static random access memory (SRAM).

In some embodiments, the memory macro 602 further comprises a write driver (WD) 606, a multiplexer (MUX) 608, a sense amplifier (SA) 610 and a control circuit 612. In some embodiments, the WD 606 is configured to provide a necessary voltage and/or current required to program the memory cell array 604. In some embodiments, the MUX 608 is configured to select a path to forward input signal to the output. In some embodiments, the SA 610 is configured to compare voltages or currents generated during a read operation with a pre-defined threshold value.

In some embodiments, the control circuit 612 is a representative device and may comprise a processor, a memory, an input/output interface, a communications interface, and a system bus. The processor may comprise any processing circuitry operative to control the operations and performance of the control circuit 612 of the memory macro 602. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the control circuit 612 of the memory macro 602.

For example, the memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C #, Python, Objective-C, Visual Basic, or .NET programming. In some embodiments a compiler or interpreter is comprised to convert the instruction set into machine executable code for execution by the processor.

In some embodiments, the I/O interface may comprise any suitable mechanism or component to at least enable a user to provide input (i.e., test/request and or test/normal modes, etc.) to the control circuit 612 of the memory macro 602 and the control circuit 612 of the memory macro 602 to provide output control to the other components of the memory macro 602 (e.g., the memory cell array 604, the WD 606, the MUX 608 and the SA 610).

In some embodiments, the neural network macro 650 further comprises 2 selectors 614/616. In some embodiments, the selector 614 is configured to swap the input to form a mapped input for the memory cell array 604 according to a swapping decision as discussed in FIGS. 5A and 5B and the selector 616 is configured to swap the output of the memory cell array 604 according to the swapping decision as discussed in FIGS. 5A and 5B.

In some embodiments, the neural network macro 650 further comprises a memory 618.

In some embodiments, the memory may comprise any machine-readable or computer-readable media capable of storing data, including both volatile/non-volatile memory and removable/non-removable memory. The memory may comprise at least one non-volatile memory unit. For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory 618 contains a defect pattern $[D_1]_{N \times M}$ as discussed in FIGS. 3A-3B, in the form of a file or any acceptable form of machine-readable instructions. In some embodiments, the memory 618 comprises address of the corresponding defective memory cells in the memory cell array 604. In some embodiments, the defect pattern pre-stored in the memory 618 is determined by measuring the memory cell array 604 during a manufacturing process.

In some embodiments, the neural network macro 650 further comprises a controller 620. In some embodiments, the controller 620 is configured to receive the defect pattern from the memory 618 and a weight pattern sensitivity (WPS) 624. In some embodiments, the controller 620 is further configured to determine a swapping decision based on the defect pattern 300 and the WPS 624 so as to instruct the selectors 614/616 to perform an I/O swap.

In some embodiments, the neural network macro 650 further comprises a buffer 802 and a processor 804. In some embodiments, the buffer 802 stores a plurality of weights which are used by the processor 804 to determine the WPS 624. In some embodiments, the processor 804 is enabled by an EN signal 806 to determine the WPS 624 according to the plurality of weights stored in the buffer 802. In some embodiments, the outside of the system interface 650 further comprises at least one of the following: a processing unit, a sensing unit, and a power regulation unit, all of which are not shown.

Figure 9:
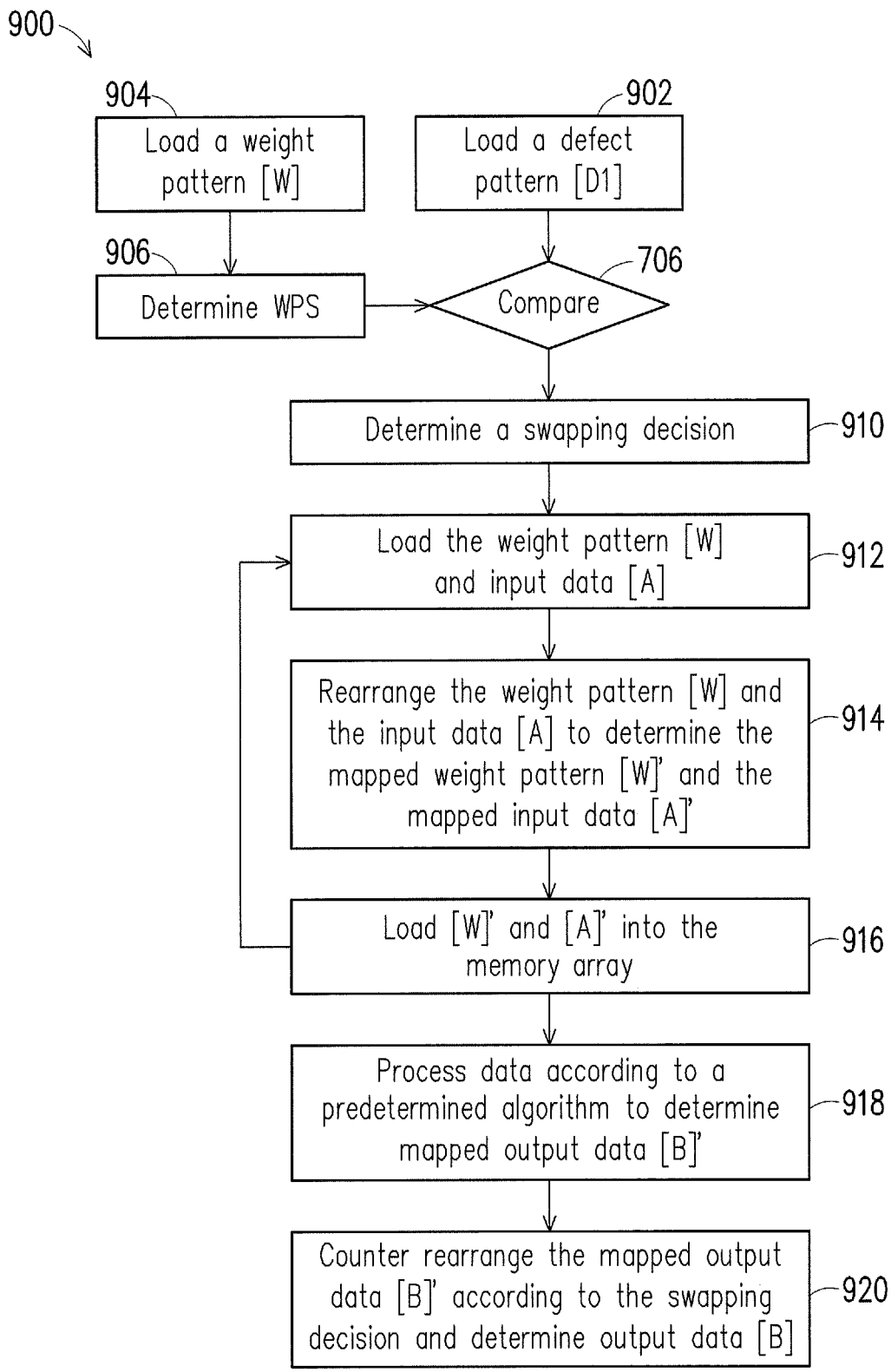
FIG. 9 illustrates a flow chart of a method for performing a calculation of values on each of the neurons on a hidden layer of a network, in accordance with some embodiments of the present disclosure.

FIG. 9 illustrates a flow chart of a method 900 for performing a calculation of values on each of the neurons 108 on a hidden layer 114 of a network 100, in accordance with some embodiments of the present disclosure. In some embodiments, the operations of method 900 are performed by the respective components illustrated in FIGS. 1-4, 5, 7B, and 8. For purposes of discussion, the following embodiment of the method 900 will be described in conjunction with FIGS. 1-4, 5, 7B, and 8. The illustrated embodiment of the method 900 is merely an example for performing a calculation of values on each of the neurons 108 on a hidden layer 114 of a network 100. Therefore, it should be understood that any of a variety of operations may be omitted, re-sequenced, and/or added while remaining within the scope of the present disclosure. It should be also noted the network 100 may comprises a plurality of hidden layers and each of the plurality of hidden layers may comprises different numbers of neurons, the I/O's that are determined to be swapped may be more than 2, and values on each of the neurons can be determined using different algorithms, which are all within the scope of this invention.

The method 900 starts with operation 902, in which a defect pattern $[D_1]_{N \times M}$ 300 of a memory cell array 604 is loaded into a memory 618 of a neural network macro 650 according to some embodiments. In some embodiments, the defect pattern $[D_1]_{N \times M}$ 300 contains addresses of defective memory cells in the memory cell array 604. In some embodiments, a defect pattern indicator (DPI) 306 can be loaded into the controller 620. In some embodiments, the DPI 306 comprises row and m columns, wherein m=log 2M, M is the number of columns in the corresponding defect pattern $[D_1]_{N \times M}$ 300. In some embodiments, when the number of defective memory cells in a column 302-j of the defect pattern $[D]_{N \times M}$ 300 is equal to or greater than a predefined threshold value, the DPI 306 is determined as the address of the column 302-j. In some other embodiments, the DPI 306 can also comprises N rows and 1 column with respect to the corresponding defect pattern $[D_1]_{N \times M}$ 300, which comprises N rows and M columns. In some embodiments, when the number of defective memory cells in a column 302-j of the defect pattern $[D_1]_{N \times M}$ 300 is equal to or greater than a predefined threshold value, the value of the dj in the DPI 306 is determined as "0"; and when the number of defective memory cells in a column 302-j of the defect pattern $[D_1]_{N \times M}$ 300 is less than the predetermined threshold value, the corresponding dj in the DPI 306 is determined as "1". In some embodiments, the defect pattern $[D_1]_{N \times M}$ 300 or a DPI 306 can be stored in a memory 618.

In some embodiments, the defect pattern $[D_1]_{N \times M}$ 300 can be determined by measuring the memory cell array 604. In some embodiments, the operation 902 further comprises writing a preconfigured logical state (e.g., "1") to each of a plurality of memory cells in the memory cell array 604 and measure a stored logical state. When the stored logical state in a memory cell is consistent with the preconfigured logical state, e.g., both are "1", the memory cell is stable and not defective. When the stored logical state in a memory cell is different from the preconfigured logical state, e.g., the stored logical state is "0", the memory cell is determined as defective and the memory cell is a defect in the memory cell array 604. In some embodiments, the operation 902 can be performed by a neural network system or a memory manufacture during a fabrication process.

The method 900 continues with operation 904, in which a weight pattern 118 $[W]_{N \times M}$ is loaded in to the neural network macro 650 as an input 622 according to some embodiments. In some embodiments, the weight pattern 118

[W]$_{N \times M}$ is determined through a training process using a software without considering the memory cell array 604 and their potential defects introduced in respective fabrication processes. In some embodiments, the weight pattern 118 [W]$_{N \times M}$ is loaded into the neural network macro 650 as the input 622 to a buffer 802 of the neural network macro 650.

The method 900 continues with operation 906, in which a weight pattern sensitivity (WPS) 200 is determined according to some embodiments. In some embodiments, the WPS 200 is determined by a processor 804 of the neural network macro 650 according to the weights of the weight pattern 118 [W]$_{N \times M}$ stored in the buffer 802. In the illustrated embodiments, the WPS 200 comprises 1 row and M columns. In some embodiments, the WPS 200 of the corresponding weight pattern 118 [W]$_{N \times M}$ can be determined according to a number of "0" or "1" in a column 202. For example, when a number of "1"s in a column 202-$j$ is equal to or greater than a predefined threshold value, the Si in the WPS 200 is determined as 1, wherein j≤N and is a positive integer. Similarly, when a number of "1"s in a column 202-$j$ is less than the predefined threshold value, the S$_j$ in the WPS 200 is determined as "0". In some embodiments, there is one WPS 200 for a corresponding weight pattern 118 [W]$_{N \times M}$. In some embodiments, the WPS 200 can be different according to different threshold values, which can be predefined or specified by the user. mprise a number of integer values corresponding to the multi-levels of threshold values.

In some embodiments, values in the WPS 200 is determined by comparing the number of positive weights in a column of a weight pattern against multi-levels of thresholds. For example, when the number of positive weights in a column of a weight pattern is equal to or greater than 0 and smaller than 5 and the WPS value for the column is 0; when the number of positive weights in a column of a weight pattern is equal to or greater than 5 and smaller than 10, the WPS value of the column is 1; when the number of positive weights in a column of a weight pattern is equal to or greater than 10 and smaller than 15, the WPS value of the column is 2; and when the number of positive weights in a column of a weight pattern is equal to or greater than 15 and smaller than the size of a column (e.g., N in FIG. 2), the WPS value of the column is 3.

The method 900 continues with operation 908, in which the WPS 200 and the defect pattern [D]$_{N \times M}$ 300 of a corresponding weight pattern 118 [W]$_{N \times M}$ are compared by the controller 620 according to some embodiments. In some other embodiments, the WPS 200 and the DPI 306 are compared by the controller 620. In some other embodiments, a product of the WPS 200 and a number of defects in each column of the defect pattern [D$_1$]$_{N \times M}$ 300 is determined. In some embodiments, the controller 620 receives the WPS 624 from the processor 804 and the defect pattern 300 from the memory 618 so as to determine a swapping decision.

The method 900 continues with operation 910, in which a swapping decision is determined by the controller 620 according to some embodiments. In some embodiments, a column in the memory cell array 604 with a highest number of defects and a highest number of 1s in a corresponding weight pattern is determined to receive weights and input data that are originally stored on a column of the memory cell array 604 with a lowest number of defects and a lowest number of 1s in the corresponding weight pattern. In some other embodiments, a statistic severity (SS) 514 is determined according to the product of the of the WPS 200 and the number of defects in each column of the defect pattern [D$_1$]$_{N \times M}$ 300. In some embodiments, a column of the memory cell array 604 of the memory cell array with a highest number in the SS 514 is determined to receive weights and input data that are originally stored on a column of the memory cell array 604 with a lowers number in the SS 514.

The method 900 continues with operation 912 in which the weight pattern 118 [W]$_{N \times M}$ is loaded to a selector 614 according to some embodiments. In some embodiments, the weight pattern 118 [W]$_{N \times M}$ is loaded to the selector 614 from the buffer 802.

The method 900 continues with operation 914 in which the weight pattern 118 [W]$_{N \times M}$ rearranged to determine a mapped weight pattern [W]'$_{N \times M}$ according to some embodiments. In some embodiments, the mapped weight pattern [W]'$_{N \times M}$ is determined according to the swapping decision determined in the operation 910. For example, a column 202-$a$ of the weight pattern 118 [W]$_{N \times M}$ at the input corresponding to the column in the memory cell array 604 with a highest number of defects and a highest number of 1s in the corresponding weight pattern 118 [W]$_{N \times M}$ switches with a column 202-$b$ of the weight pattern 118 [W]$_{N \times M}$ at the input corresponding to the column of the memory cell array 604 with a lowest number of defects and a lowest number of 1s in the corresponding weight pattern 118 [W]$_{N \times M}$, wherein a and b are positive integer and are both smaller than M.

The method 900 continues with operation 916 in which the mapped weight pattern [W]'$_{N \times M}$ is loaded to the memory cell array 604 according to some embodiments. In some embodiments, the mapped weight pattern [W]'$_{N \times M}$ is written by storing a "0" or a "1" in corresponding memory cells of the memory cell array 604. In some embodiments, the column of the memory cell array 604 with a highest number of defects and a highest number of 1s in the corresponding weight pattern receives the weights that are originally stored in the column of the memory cell array 604 with a lowest number of defects and a lowest number of 1s in the corresponding weight pattern. Similarly, the column of the memory cell array 604 with a lowest number of defects and a lowest number of 1s in the corresponding weight pattern receives the weights that are originally stored in the column of the memory cell array 604 with a highest number of defects and a highest number of 1s in the corresponding weight pattern. All the other columns receive their corresponding weights without further modification.

The method 900 continues with operation 912 in which the values on the neurons 106 of the input layer 112 are loaded to the neural network macro 650 according to some embodiments. In some embodiments, the values on the neurons 106 of the input layer 112 are input data [A]$_{M \times 1}$. In some embodiments, [A]$_{M \times 1}$ can be loaded from an output of a previous network.

The method 900 continues with operation 914 in which the input data [A]$_{M \times 1}$ is rearranged to determine a mapped input data [A]'$_{M \times 1}$ according to some embodiments. In some embodiments, the mapped input data [A]'$_{M \times 1}$ is determined according to the swapping decision determined in the operation 910. In some embodiments, the mapped input data [A]'$_{M \times 1}$ is then transposed from a column to a row ([A]'$_{1 \times M}$) prior to load to the memory cell array 604. In some embodiments, the mapped input data [A]'$_{M \times 1}$ is obtained according to the method 730 shown in FIG. 7B.

The method 900 continues with operation 916 in which the mapped and transposed input data [A]'$_{1 \times M}$ is loaded into the memory cell array 604 according to some embodiments.

The method 900 continues with operation 918 in which a mapped output data [B]'$_{N \times M}$ is determined according to some embodiments. In some embodiments, the mapped output data $[B]'_{N \times M}$ is determined according to a predetermined algorithm. In some embodiments, the mapped and transposed input data $[A]'_{1 \times M}$ and the mapped weight pattern $[W]'_{N \times M}$ are processed in corresponding memory cells through in-bit multiplication.

The method 900 continues with operation 920 in which an output data $[B]_{N \times M}$ is determined according to some embodiments. In some embodiments, the output data $[B]_{N \times M}$ is determined through a reverse arrangement of the mapped output data $[B]'_{N \times M}$ according to the swapping decision. Continue with the example discussed in FIG. 7B, output data on column 202-a of the memory cell array is then output on output I/O of the corresponding column 202-b and output data on column 202-b of the memory cell array is then output on output I/O of the corresponding column 202-b. In some embodiments, the swapping decision is received by a selector 616 from the controller 620. In some embodiments, the operation 920 is performed by the selector 616 at the output of the neural network macro 650 of FIG. 8.

In one embodiment, a method for performing a calculation of values on first neurons of a first layer in a neural network, includes: receiving a first pattern of a memory cell array, wherein the memory cell array comprises a plurality of memory cells configured in a plurality of columns and a plurality of rows; determining a second pattern of the memory cell array using a third pattern; determining at least one pair of columns of the memory cell array according to the first pattern and the second pattern; switching input data of two columns of each of the at least one pair of columns of the memory cell array; performing a bit-wise calculation using the input data stored in the plurality of memory cells; and switching output data of the two columns in each of the at least one pair of columns of the memory cell array so as to determine the values on the first neurons of the first layer.

In another embodiment, a system for performing a calculation of values on first neurons of a first layer in a neural network, includes: a memory cell array comprising a plurality of memory cells configured in a plurality of columns and a plurality of rows; a memory unit configured to store a first pattern; a processor unit configured to determine a second pattern using a third pattern; a controller unit configured to determine at least one pair of columns of the memory cell array according to the first a pattern received from the memory unit and the second pattern received from the processor unit; a first selector configured to switch input data of two columns in each of the at least one pair of columns of the memory cell array; and a second selector configured to switch output data of the two columns in each of the at least one pair of columns of the memory cell array so as to determine the values on the respective neurons.

Yet, in another embodiment, a system for performing a calculation of values on first neurons of a first layer in a neural network, incudes: a memory cell array comprising a plurality of memory cells configured in a plurality of columns and a plurality of rows; a memory unit configured to store a first pattern; a processor unit configured to determine a second pattern using a third pattern; a controller unit configured to determine at least one pair of columns of the memory cell array according to the first a pattern received from the memory unit and the second pattern received from the processor unit; a first selector configured to switch input data of two columns in each of the at least one pair of columns of the memory cell array; and a second selector configured to switch output data of the two columns in each of the at least one pair of columns of the memory cell array so as to determine the values on the respective neurons, wherein the first pattern is a defect pattern, wherein the defect pattern maps at least one defective memory cell in the memory cell array, wherein the second pattern comprises a plurality of weight pattern sensitivity values, wherein each of the plurality of weight pattern sensitivity values is determined by comparing at least one predetermined threshold value with one of the following in a corresponding column in the third pattern: a number of logical "1" values and a second number of logical "0" values, and wherein the third pattern is a weight pattern comprising a plurality of weights, wherein each of the plurality of weights has a value of "0" or "1".

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a first pattern of a plurality of memory cells;
   receiving a second pattern of the plurality of memory cells;
   determining at least one memory cell of the plurality of memory cells according to the first pattern and the second pattern;
   switching input data of the at least one memory cell of the memory cell array;
   performing a calculation using the input data stored in the plurality of memory cells; and
   switching output data of at least one memory cell of the plurality of memory cells so as to determine values on first neurons of a first layer of a neural network.

2. The method of claim 1, wherein the first pattern is a defect pattern, wherein the defect pattern maps at least one defective memory cell in the plurality of memory cells.

3. The method of claim 1, further comprising:
   prior to receiving the first pattern,
   writing a preconfigured logical state to each of the plurality of memory cells;
   measuring a stored logical state in each of the plurality of memory cells; and
   comparing the preconfigured logical state and the stored logical state in each of the plurality of memory cells so as to determine at least one defective memory cell.

4. The method of claim 1, wherein the second pattern comprises a plurality of weight pattern sensitivity values, wherein each of the plurality of weight pattern sensitivity values is determined by comparing at least one predetermined threshold value with one of: a first number of logic "1" values and a second number of logic "0" values.

5. The method of claim 1, wherein the second pattern is determined using a third pattern, and wherein the third pattern is a weight pattern comprising a plurality of weights, wherein each of the plurality of weights has a value of "0" or "1".

6. The method of claim 5, wherein the third pattern is determined through an off-chip training process.

7. The method of claim 1, wherein the plurality of memory cells form a memory cell array having a plurality of columns and a plurality of rows, and wherein the determining at least one memory cell further comprises:
- determining a number of defective memory cells in each of the plurality of columns of the memory cell array according to the first pattern;
- determining a statistic severity value of each of the plurality of columns, wherein the statistic severity value of a corresponding column is determined as a product of the number of defective memory cells and a value of the corresponding column in the second pattern; and
- determining the at least one pair of columns according to the statistic severity value.

8. The method of claim 1, wherein the input data comprises one of the following: a third pattern and output data of second neurons of a second layer, wherein the second neurons of the second layer are coupled to the first neurons of the first layer.

9. A system for performing a calculation of values on first neurons of a first layer in a neural network, comprising:
- a plurality of memory cells;
- a memory unit configured to store a first pattern;
- a processor unit configured to determine a second pattern;
- a controller unit configured to determine at least one pair of memory cells of the plurality of memory cells according to the first pattern received from the memory unit and the second pattern received from the processor unit;
- a first selector configured to switch input data of the at least one pair of memory cells of the memory cell array; and
- a second selector configured to switch output data in each of the at least one pair of memory cells of the plurality of memory cells to determine the values on the respective neurons.

10. The system of claim 9, wherein the first pattern is a defect pattern, wherein the defect pattern maps at least one defective memory cell in the plurality of memory cells.

11. The system of claim 9, wherein the first pattern is determined by:
- writing a preconfigured logical state to each of the plurality of memory cells;
- measuring a stored logical state in each of the plurality of memory cells; and
- comparing the preconfigured logical state and the stored logical state in each of the plurality of memory cells.

12. The system of claim 9, wherein the second pattern comprises a plurality of weight pattern sensitivity values, wherein each of the plurality of weight pattern sensitivity values is determined by comparing at least one predetermined threshold value with one of: a number of logical "1" values and a second number of logical "0" values.

13. The system of claim 9, wherein the second pattern is determined by a third pattern, and wherein the third pattern is a weight pattern comprising a plurality of weights, wherein each of the plurality of weights has a value of "0" or "1".

14. The system of claim 13, wherein the input data comprises one of the following: the third pattern and output data of second neurons of a second layer, wherein the second neurons of the second layer are coupled to the first neurons of the first layer.

15. The system of claim 14, wherein the third pattern is determined through an off-chip training process.

16. The system of claim 9, wherein the first selector and the second selector are controlled by the controller.

17. The system of claim 9, wherein the plurality of memory cells form a memory cell array having a plurality of columns and a plurality of rows, and wherein the at least one pair of columns is determined according to statistic severity values of the plurality of columns, wherein each of the statistic severity values of a corresponding column is determined as a product of a number of defective memory cells of the corresponding column and a value of the corresponding column in the second pattern.

18. A system for performing a calculation of values on first neurons of a first layer in a neural network, comprising:
- a plurality of memory cells;
- a memory unit configured to store a first pattern;
- a processor unit configured to determine a second pattern;
- a controller unit configured to determine at least one pair of memory cells according to the first pattern received from the memory unit and the second pattern received from the processor unit;
- a first selector configured to switch input data to the at least one pair of memory cells; and
- a second selector configured to switch output data of the at least one pair of memory cells so as to determine the values on the respective neurons,
- wherein the first pattern is a defect pattern, wherein the defect pattern maps at least one defective memory cell of the plurality of memory cells, wherein the second pattern comprises a plurality of weight pattern sensitivity values.

19. The system of claim 18, wherein the input data comprises one of the following: a third pattern and output data of second neurons of a second layer, wherein the second neurons of the second layer are coupled to the first neurons of the first layer and the third pattern is determined through an off-chip training process.

20. The system of claim 18, wherein each of the plurality of weight pattern sensitivity values is determined by comparing at least one predetermined threshold value with one of: a number of logical "1" values, and a second number of logical "0" values, and wherein the third pattern is a weight pattern comprising a plurality of weights, wherein each of the plurality of weights has a value of "0" or "1".

* * * * *